(12) United States Patent
Lee et al.

(10) Patent No.: US 12,538,642 B2
(45) Date of Patent: Jan. 27, 2026

(54) ORGANIC LIGHT-EMITTING DIODE INCLUDING CHARGE GENERATION LAYER HAVING METAL INTERLAYER WITH SPECIFIED WORK FUNCTION AND DISPLAY APPARATUS INCLUDING THE SAME

(71) Applicant: Samsung Display Co., Ltd., Yongin-si (KR)

(72) Inventors: Hakchoong Lee, Yongin-si (KR); Jihye Lee, Yongin-si (KR); Myungsuk Han, Yongin-si (KR); Dongchan Kim, Yongin-si (KR); Yoonseok Ka, Yongin-si (KR); Jiyoung Moon, Yongin-si (KR)

(73) Assignee: Samsung Display Co., Ltd., Yongin-si (KR)

(*) Notice: Subject to any disclaimer, the term of this patent is extended or adjusted under 35 U.S.C. 154(b) by 681 days.

(21) Appl. No.: 17/483,675

(22) Filed: Sep. 23, 2021

(65) Prior Publication Data

US 2022/0209157 A1    Jun. 30, 2022

(30) Foreign Application Priority Data

Dec. 24, 2020   (KR) ........................ 10-2020-0183751

(51) Int. Cl.
*H10K 50/19*    (2023.01)
*H10K 50/13*    (2023.01)
(Continued)

(52) U.S. Cl.
CPC ........... *H10K 50/19* (2023.02); *H10K 50/131* (2023.02); *H10K 59/38* (2023.02); *H10K 59/12* (2023.02); *H10K 2102/351* (2023.02)

(58) Field of Classification Search
CPC ...... H10K 50/131; H10K 59/12; H10K 59/38; H10K 2102/351; H10K 50/19;
(Continued)

(56) References Cited

U.S. PATENT DOCUMENTS 10,283,569 B2    5/2019   Bi
10,658,431 B2    5/2020   Liao
(Continued)

FOREIGN PATENT DOCUMENTS

KR    10-2018-0058032    5/2018
KR    10-1941084    1/2019
(Continued)

OTHER PUBLICATIONS

"Contact." Merriam-Webster.com Dictionary, Merriam-Webster, https://www.merriam-webster.com/dictionary/contact. Accessed Mar. 20, 2024. (Year: 2024).*

*Primary Examiner* — Davienne N Monbleau
*Assistant Examiner* — John Patrick Cornely
(74) *Attorney, Agent, or Firm* — Womble Bond Dickinson (US) LLP

(57) ABSTRACT

A display apparatus including a pixel electrode disposed on a substrate, an opposite electrode disposed to face the pixel electrode, a first emission layer and a second emission layer disposed on the first emission layer and overlapping each other between the pixel electrode and the opposite electrode, and a charge generation layer disposed between the first emission layer and the second emission layer, in which the charge generation layer includes an n-type charge generation layer, a p-type charge generation layer, and a metal interlayer disposed between the n-type charge generation layer and the p-type charge generation layer, and the metal interlayer includes metal having a work function of about −6.0 eV to about −3.5 eV.

22 Claims, 15 Drawing Sheets

(51) Int. Cl.
*H10K 59/38* (2023.01)
*H10K 59/12* (2023.01)
*H10K 102/00* (2023.01)

(58) Field of Classification Search
CPC ............... H10K 50/12; H10K 2101/00; H10K 2102/331; G09G 3/3233
See application file for complete search history.

(56) References Cited

U.S. PATENT DOCUMENTS

| | | | |
|---|---|---|---|
| 2007/0046189 A1* | 3/2007 | Hatwar | H10K 50/19 |
| | | | 428/917 |
| 2017/0357135 A1* | 12/2017 | Gillaspie | G02F 1/1524 |
| 2018/0076409 A1* | 3/2018 | Tanaka | H10K 50/16 |
| 2019/0326542 A1 | 10/2019 | Yang et al. | |
| 2020/0106025 A1 | 4/2020 | Shin et al. | |
| 2020/0194704 A1 | 6/2020 | Seo et al. | |
| 2020/0295093 A1* | 9/2020 | Thompson | H10K 50/19 |

FOREIGN PATENT DOCUMENTS

| | | |
|---|---|---|
| KR | 10-2019-0123829 | 11/2019 |
| KR | 10-2020-0037654 | 4/2020 |
| KR | 10-2020-0072124 | 6/2020 |

\* cited by examiner

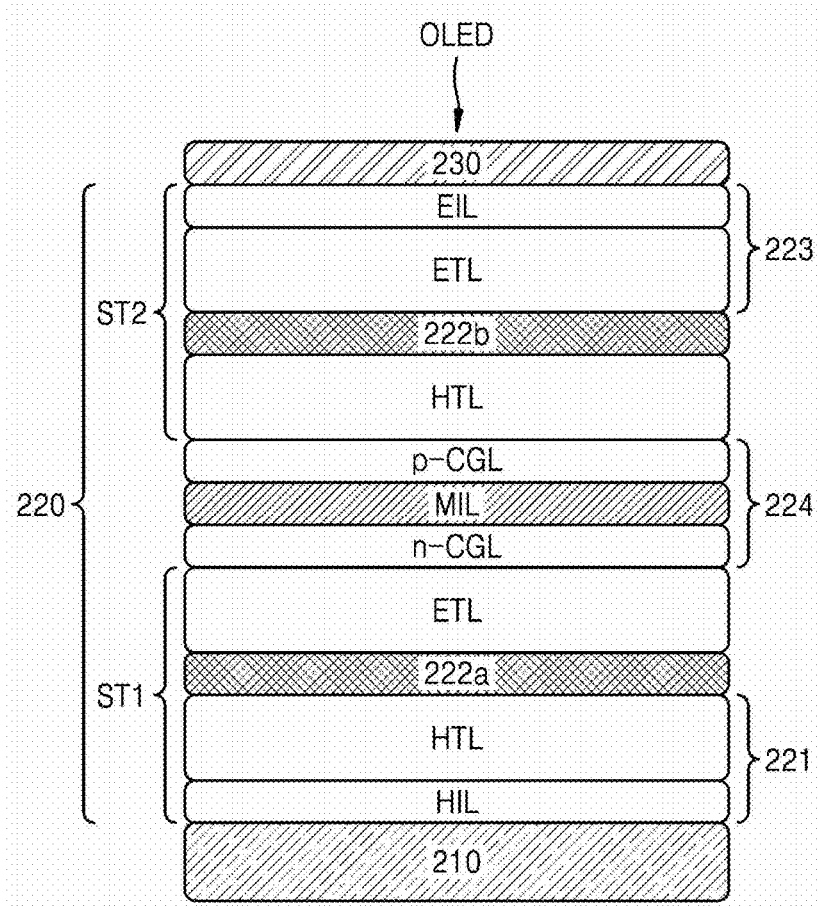

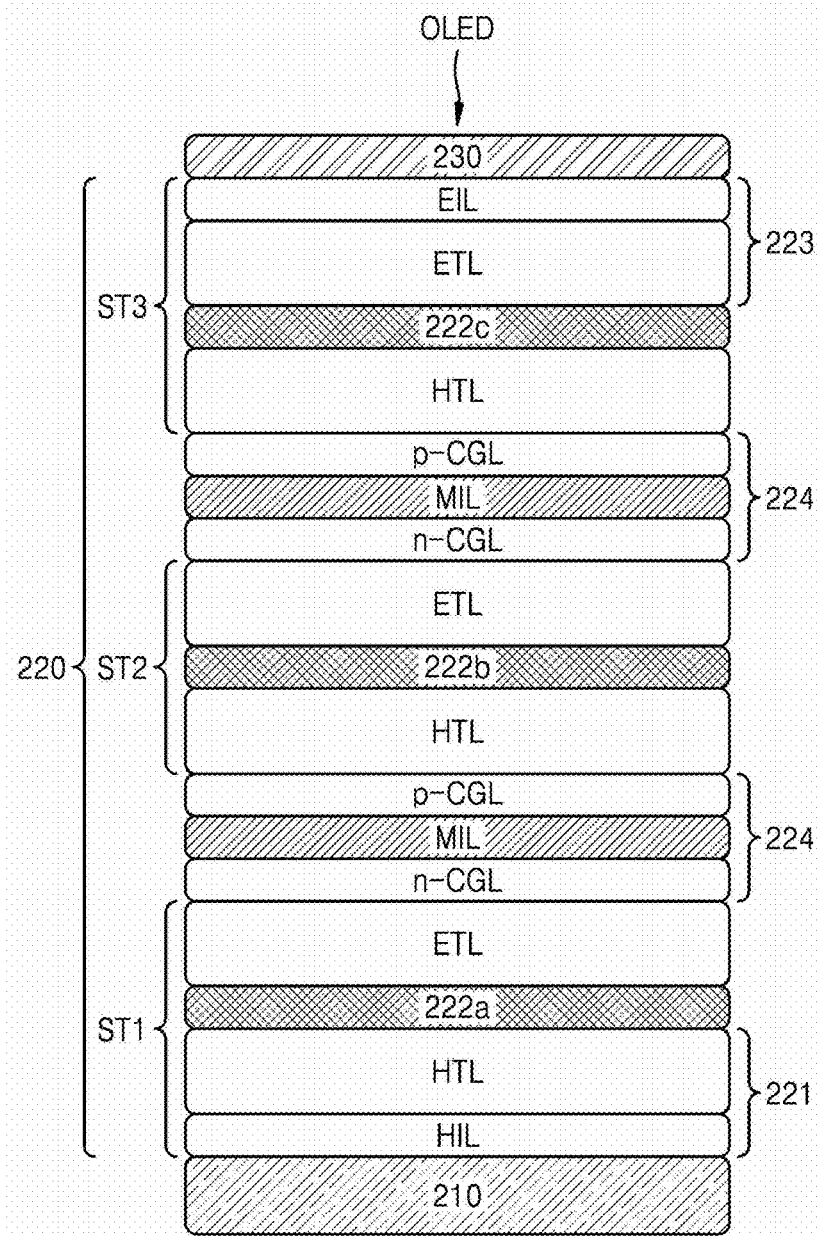

FIG. 10

| METAL INTERLAYER (MIL) (Mg) | OLED only | | OLED + ANTI-REFLECTIVE LAYER | | | | | | |
|---|---|---|---|---|---|---|---|---|---|
| | | | R | G | B | | W | |
| | EFFICIENCY | ΔEFFICIENCY | EFFICIENCY | EFFICIENCY | EFFICIENCY | CONVERTED EFFICIENCY | W EFFICIENCY | ΔW EFFICIENCY |
| COMPARATIVE EXAMPLE | 22.1 | – | 3.0 | 6.8 | 2.4 | 55.0 | 4.8 | – |
| EXAMPLE 1: MIL (10 Å) | 23.4 | 5.9% | 3.6 | 8.0 | 2.8 | 63.6 | 5.6 | 15.9% |
| EXAMPLE 2: MIL (20 Å) | 22.7 | 2.7% | 3.7 | 7.9 | 2.9 | 65.6 | 5.7 | 17.4% |
| EXAMPLE 3: MIL (30 Å) | 23.2 | 5.0% | 3.6 | 7.8 | 2.5 | 59.7 | 5.5 | 13.9% |

FIG. 13

| METAL INTERLAYER (MIL) (Mg) | OLED only | |
|---|---|---|
| | EFFICIENCY | ΔEFFICIENCY |
| COMPARATIVE EXAMPLE | 49.4 | – |
| EXAMPLE 4: MIL3 (10Å) | 50.7 | 2.6% |
| EXAMPLE 5: All MIL (10Å) | 49.8 | 0.8% |
| EXAMPLE 6: MIL2 (30Å) | 50.2 | 1.6% |
| EXAMPLE 7: MIL3 (30Å) | 50.7 | 2.6% |

ORGANIC LIGHT-EMITTING DIODE INCLUDING CHARGE GENERATION LAYER HAVING METAL INTERLAYER WITH SPECIFIED WORK FUNCTION AND DISPLAY APPARATUS INCLUDING THE SAME

CROSS-REFERENCE TO RELATED APPLICATION

This application claims priority from and the benefit of Korean Patent Application No. 10-2020-0183751, filed on Dec. 24, 2020, which is hereby incorporated by reference for all purposes as if fully set forth herein.

BACKGROUND

Field

Embodiments of the invention relate generally to an organic light-emitting diode and a display apparatus including the same, and more particularly, to an organic light-emitting diode having low driving voltage, high efficiency, and long lifespan, and a display apparatus including the same.

Discussion of the Background

Among the display apparatuses, an organic light-emitting display apparatus is drawing attention as a next generation display apparatus not only due to its wide viewing angle and superior contrast, but also due to its fast response speed.

In general, in an organic light-emitting display apparatus, thin-film transistors and organic light-emitting diodes (organic light-emitting elements) are arranged on a substrate and the organic light-emitting diodes emit light by themselves. The organic light-emitting display apparatus is used as a display unit of a small product such as a mobile phone, and is also used as a display unit of a large product such as a television.

An organic light-emitting diode may have a structure in which a first electrode is arranged on a substrate, and a hole transport region, an emission layer, an electron transport region, and a second electrode are sequentially formed on the first electrode. Holes injected from the first electrode move to the emission layer via the hole transport region, and electrons injected from the second electrode move to the emission layer via the electron transport region. Carriers such as holes and electrons recombine in an emission layer region to generate excitons. Light is generated as these excitons change from an excited state to a ground state.

The above information disclosed in this Background section is only for understanding of the background of the inventive concepts, and, therefore, it may contain information that does not constitute prior art.

SUMMARY

Organic light-emitting diodes constructed according to illustrative embodiments of the invention are capable of providing low driving voltage, high efficiency, and long lifespan, and a display apparatus including the same.

Additional features of the inventive concepts will be set forth in the description which follows, and in part will be apparent from the description, or may be learned by practice of the inventive concepts.

According to one or more embodiments, a display apparatus includes a pixel electrode disposed on a substrate, an opposite electrode disposed to face the pixel electrode, a first emission layer and a second emission layer disposed on the first emission layer and overlapping each other between the pixel electrode and the opposite electrode, and a charge generation layer disposed between the first emission layer and the second emission layer, in which the charge generation layer includes an n-type charge generation layer, a p-type charge generation layer, and a metal interlayer between the n-type charge generation layer and the p-type charge generation layer, and the metal interlayer includes metal having a work function of about −6.0 eV to about −3.5 eV.

A thickness of the metal interlayer may be in a range of about 1 Å to about 100 Å.

A thickness of the metal interlayer may be less than a thickness of the n-type charge generation layer and a thickness of the p-type charge generation layer.

The metal interlayer may include at least one of bismuth (Bi), magnesium (Mg), and zinc (Zn).

The metal interlayer may include a single layer.

The metal interlayer may include metal particles dispersed on the n-type charge generation layer.

The n-type charge generation layer and the p-type charge generation layer may be in contact with each other in at least some areas with the metal interlayer therebetween.

The n-type charge generation layer may include an organic semiconductor material and a metal dopant.

The metal dopant may include metal having a work function of less than −3 eV.

The metal dopant may include at least one of a lanthanum-based metal and an alkali-based metal.

The metal dopant may include at least one of lithium (Li), ytterbium (Yb), dysprosium (Dy), europium (Eu), and samarium (Sm).

A volume ratio of the organic semiconductor material to the metal dopant may be about 99:1 to about 90:10.

The p-type charge generation layer may include a first organic semiconductor material and a second organic semiconductor material, and a volume ratio of the first organic semiconductor material to the second organic semiconductor material may be about 99:1 to about 80:20.

The display apparatus may further include a color conversion layer disposed on the opposite electrode to correspond to the pixel electrode, and a color filter disposed on the color conversion layer.

The color conversion layer may include quantum dots.

The thickness of the metal interlayer may be in a range of about 10 Å to about 30 Å.

According to one or more embodiments, an organic light-emitting diode includes a pixel electrode disposed on a substrate, an opposite electrode disposed to face the pixel electrode, 'm' emitting units disposed between the pixel electrode and the opposite electrode, 'm' being an integer greater than or equal to 2, and 'm−1' charge generation layers disposed between two adjacent emitting units among the m emitting units, and include an n-type charge generation layer and a p-type charge generation layer, in which at least one of the 'm−1' charge generation layers includes a metal interlayer disposed between the n-type charge generation layer and the p-type charge generation layer, and the metal interlayer includes metal having a work function of about −6.0 eV to about −3.5 eV.

A thickness of the metal interlayer may be in a range of about 1 Å to about 100 Å.

The metal interlayer may include at least one of bismuth (Bi), magnesium (Mg), and zinc (Zn).

The metal interlayer may include metal particles dispersed on the n-type charge generation layer.

The n-type charge generation layer and the p-type charge generation layer may be in contact with each other in at least some areas with the metal interlayer therebetween.

The n-type charge generation layer may include an organic semiconductor material and a metal dopant, and the metal dopant may include metal having a work function of less than −3 eV.

The metal dopant may include a lanthanum-based metal.

The metal dopant may include at least one of lithium (Li), ytterbium (Yb), dysprosium (Dy), europium (Eu), and samarium (Sm).

The above and other aspects, features, and advantages of certain embodiments of the disclosure will be more apparent from the following description, the accompanying drawings, and claims.

These general and specific aspects may be implemented by using a system, a method, a computer program, or a combination of a certain system, method, and computer program.

It is to be understood that both the foregoing general description and the following detailed description are illustrative and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate illustrative embodiments of the invention, and together with the description serve to explain the inventive concepts.

FIG. 3 is a schematic cross-sectional view of an organic light-emitting diode which may be used in a display apparatus according to an embodiment.

FIGS. 6 and 7 are schematic cross-sectional views of an organic light-emitting diode which may be used in a display apparatus according to embodiments.

FIG. 10 is a table illustrating the efficiency of organic light-emitting diodes according to embodiments.

FIG. 13 is a table illustrating the efficiency of organic light-emitting diodes according to embodiments.

DETAILED DESCRIPTION

Figure 1A:
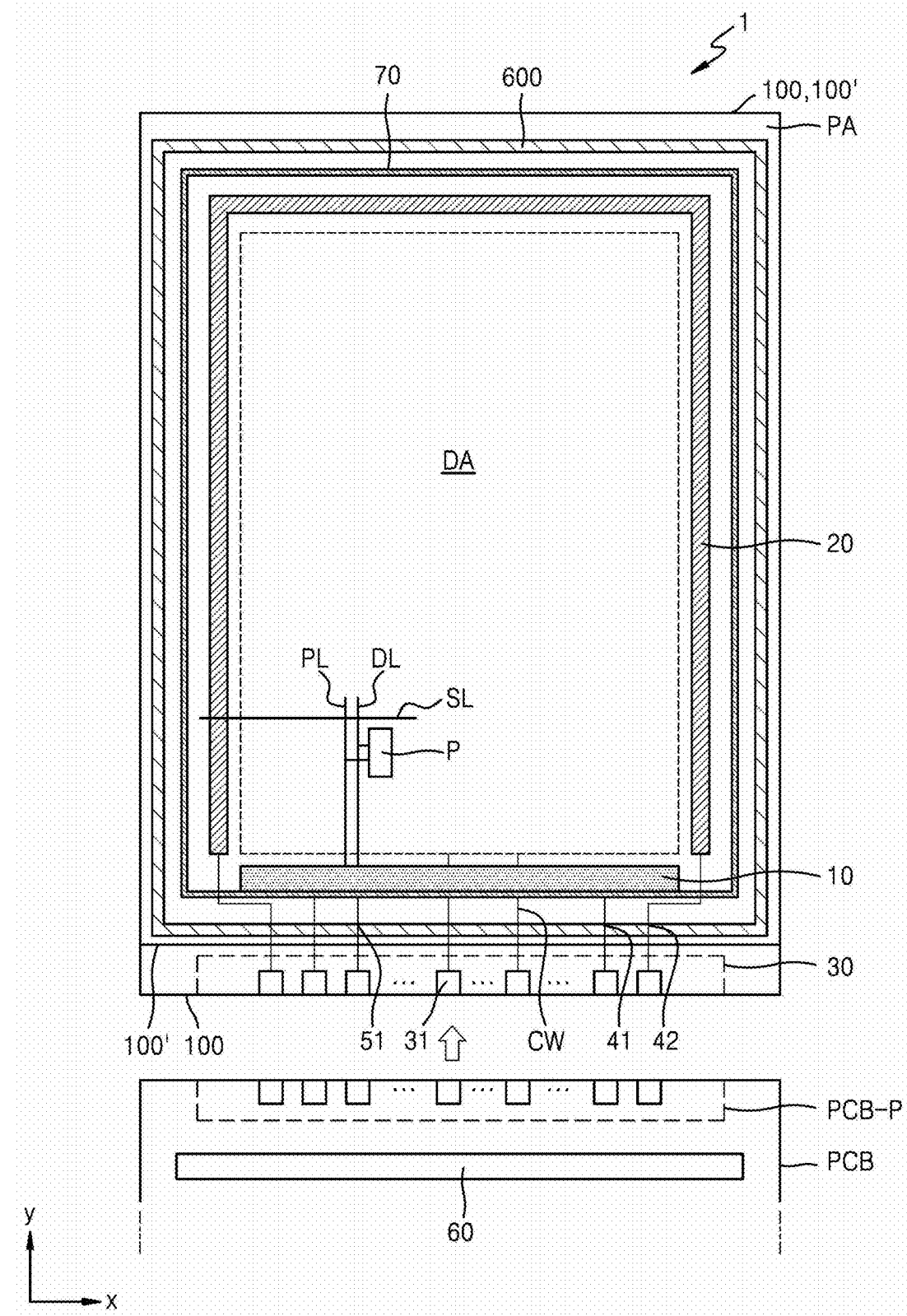
FIGS. 1A and 1B are schematic plan views illustrating examples of a display apparatus according to embodiments.

In the following description, for the purposes of explanation, numerous specific details are set forth in order to provide a thorough understanding of various embodiments or implementations of the invention. As used herein "embodiments" and "implementations" are interchangeable words that are non-limiting examples of devices or methods employing one or more of the inventive concepts disclosed herein. It is apparent, however, that various embodiments may be practiced without these specific details or with one or more equivalent arrangements. In other instances, well-known structures and devices are shown in block diagram form in order to avoid unnecessarily obscuring various embodiments. Further, various embodiments may be different, but do not have to be exclusive. For example, specific shapes, configurations, and characteristics of an embodiment may be used or implemented in another embodiment without departing from the inventive concepts.

Unless otherwise specified, the illustrated embodiments are to be understood as providing illustrative features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the D1-axis, the D2-axis, and the D3-axis are not limited to three axes of a rectangular coordinate system, such as the x, y, and z-axes, and may be interpreted in a broader sense. For example, the D1-axis, the D2-axis, and the D3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various embodiments are described herein with reference to sectional and/or exploded illustrations that are schematic illustrations of idealized embodiments and/or intermediate structures. As such, variations from the shapes of the illustrations as a result, for example, of manufacturing techniques and/or tolerances, are to be expected. Thus, embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

A display apparatus may display an image and may include an organic light-emitting display apparatus, an inorganic light-emitting display apparatus, a quantum dot light-emitting display apparatus, or the like.

Hereinbelow, a display apparatus will be described with reference to an organic light-emitting display apparatus according to an embodiment, however, the inventive concepts are not limited thereto and various types of display apparatuses may be used.

Figure 1B:
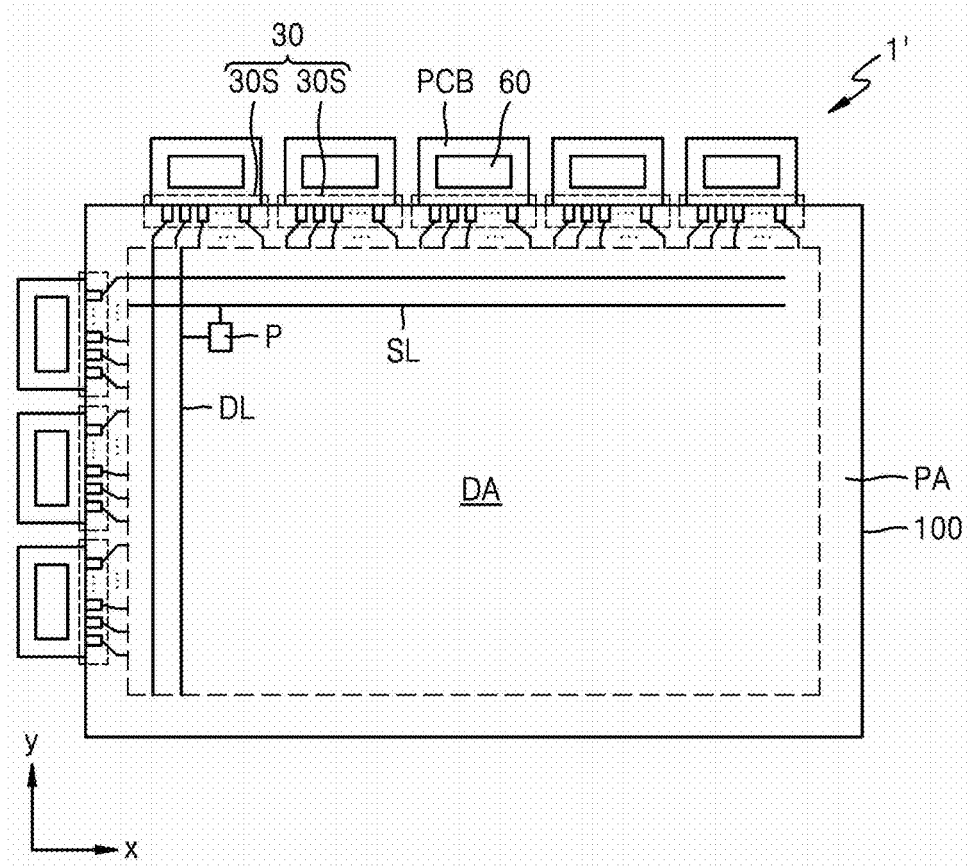

FIGS. 1A and 1B are schematic plan views illustrating examples of a display apparatus according to embodiments.

FIGS. 1A and 1B illustrate display apparatuses 1 and 1' having substantially a rectangular display area DA. In FIGS. 1A and 1B, various components may be arranged on a substrate 100 having a long axis and a short axis. From a user's perspective, FIG. 1A illustrates the display apparatus 1 in which a horizontal direction (e.g., an x-direction) is a short axis and a vertical direction (e.g., a y-direction) is a long axis, and FIG. 1B illustrates the display apparatus 1' in which a horizontal direction (e.g., an x-direction) is a long axis and a vertical direction (e.g., a y-direction) is a short axis. In the display apparatuses 1 and 1' according to embodiments, a printed circuit board PCB may be arranged in a short-axis direction of the display apparatus 1 as shown in FIG. 1A, and a printed circuit board PCB may be arranged in short-axis and long-axis directions of the display apparatus 1' as shown in FIG. 1B. In an embodiment, the display apparatus 1 shown in FIG. 1A may be used in small and medium-sized electronic devices, such as mobile phones, smartphones, tablet personal computers (PCs), mobile communication terminals, electronic notebooks, electronic books, portable multimedia players (PMPs), etc., and the display apparatus 1' as in FIG. 1B may be used in large electronic devices, such as televisions, laptop computers, monitors, advertising boards, etc.

Referring to FIG. 1A, the display apparatus 1 may be formed by bonding the substrate 100 and an upper substrate 100' to each other with a sealing member 600. The sealing member 600 may be formed to surround outer surfaces of the substrate 100 and the upper substrate 100' to bond the substrate 100 and the upper substrate 100' to each other. The upper substrate 100' may have a size slightly smaller than that of the substrate 100 so that a pad portion 30 may be exposed.

The display apparatus 1 may include the display area DA and a peripheral area PA arranged around the display area DA. The display apparatus 1 may provide a certain image by using light emitted from a plurality of pixels P arranged in the display area DA. As used herein, the term "pixel P" may substantially mean a sub-pixel including one organic light-emitting diode.

The display area DA includes pixels P connected to a data line DL extending in the y-direction and a scan line SL extending in the x-direction crossing the y-direction. Each pixel P is also connected to a driving voltage line PL extending in the y-direction.

Each pixel P may include a display element such as an organic light-emitting diode (OLED). Each pixel P may emit red, green, blue, or white light, for example, through the OLED. In some embodiments, a color of each pixel P may be implemented by a color filter or the like arranged above the OLED, which may or may not be different from colors of light emitted from the OLEDs included in the pixels P.

Each pixel P may be electrically connected to built-in circuits arranged in the peripheral area PA. A first power supply wire 10, a second power supply wire 20, and the pad portion 30 may be arranged in the peripheral area PA.

The first power supply wire 10 may be arranged to correspond to one side of the display area DA. The first power supply wire 10 may be connected to a plurality of driving voltage lines PL that transmit a driving voltage ELVDD (see FIGS. 2A and 2B to be described below) to the pixel P.

The second power supply wire 20 having a loop shape with one open side may partially surround the display area DA. The second power supply wire 20 may supply a common voltage to an opposite electrode of the pixel P. The second power supply wire 20 may be referred to as a common voltage supply wire.

The pad portion 30 may include a plurality of pads 31 and may be arranged on one side of the substrate 100. Each pad 31 may be connected to a first connection wire 41 connected to the first power supply wire 10, connection wires CW extending to the display area DA, etc. The pads 31 of the pad portion 30 may be exposed from an insulating layer and electrically connected to the printed circuit board PCB. A terminal portion PCB-P of the printed circuit board PCB may be electrically connected to the pad portion 30.

The printed circuit board PCB may transmit a signal or power of a controller to the pad portion 30. The controller may supply a driving voltage ELVDD and a common voltage ELVSS (see FIGS. 2A and 2B to be described below) to the first and second power supply wires 10 and 20 through first and second connection wires 41 and 42.

A data driving circuit 60 may be electrically connected to the data line DL. A data signal of the data driving circuit 60 may be applied to each pixel P through a connection wire CW connected to the pad portion 30 and the data line DL connected to the connection wire CW. Although FIG. 1A illustrates that the data driving circuit 60 is arranged on the printed circuit board PCB, in another embodiment, the data driving circuit 60 may be arranged on the substrate 100. For example, the data driving circuit 60 may be arranged between the pad portion 30 and the first power supply wire 10.

A dam portion 70 may be arranged in the peripheral area PA. When an organic encapsulation layer 420 of a thin-film encapsulation layer 400 (see FIG. 8) is formed, the dam portion 70 may prevent an organic material from flowing into an edge direction of the substrate 100, thereby preventing formation of an edge tail of the organic encapsulation layer 420. The dam portion 70 may be arranged in the peripheral area PA to surround at least a portion of the display area DA. The dam portion 70 may include a plurality of dams, and when the plurality of dams are arranged, the dams may be spaced apart from each other. The dam portion 70 may be arranged closer to the display area DA than the sealing member 600 in the peripheral area PA. A built-in driving circuit portion for applying a scan signal to each pixel may be further included in the peripheral area PA. In some embodiments, the built-in driving circuit portion and the dam portion 70 may be formed to overlap each other.

The display apparatus 1' in FIG. 1B is similar to that of FIG. 1A described above. Although FIG. 1A illustrates that one printed circuit board PCB is attached to the pad portion 30, a plurality of printed circuit boards PCB may be attached to the pad portion 30 as shown in FIG. 1B. In FIG. 1B, the pad portion 30 may be arranged along two sides of the substrate 100. The pad portion 30 may be provided as a plurality of sub-pad portions 30S, and one printed circuit board PCB may be attached to each sub-pad portion 30S.

Figure 2A:
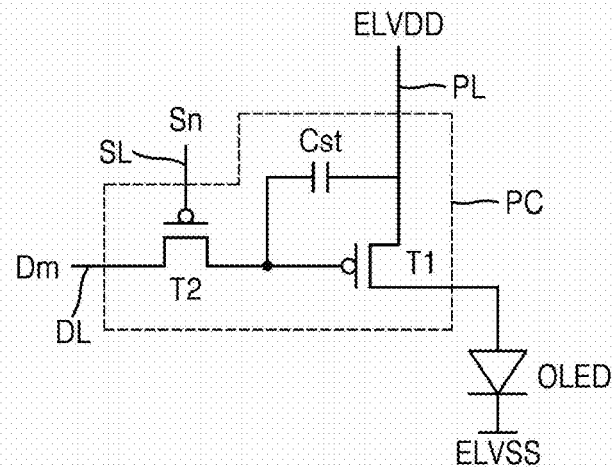
FIGS. 2A and 2B are equivalent circuit diagrams of a pixel of a display apparatus according to embodiments.
Figure 2B:
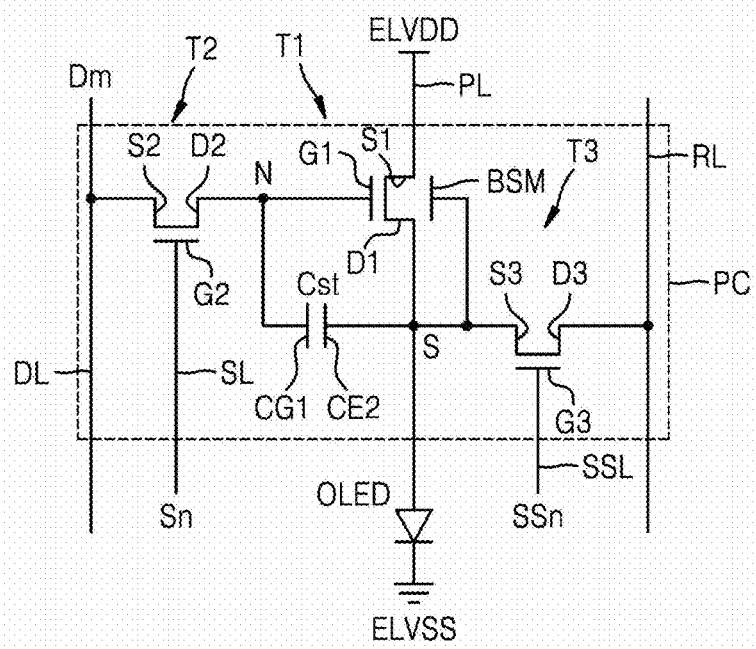

FIGS. 2A and 2B are equivalent circuit diagrams of a pixel of a display apparatus according to embodiments.

Referring to FIG. 2A, each pixel P may be implemented by a pixel circuit PC connected to the scan line SL and the data line DL, and an organic light-emitting diode OLED connected to the pixel circuit PC. The pixel circuit PC may include a driving thin-film transistor T1, a switching thin-film transistor T2, and a storage capacitor Cst. The switching thin-film transistor T2 may be connected to the scan line SL and the data line DL, and may be configured to transmit a data signal Dm input through the data line DL to the driving thin-film transistor T1 in response to a scan signal Sn input through the scan line SL.

The storage capacitor Cst may be connected to the switching thin-film transistor T2 and the driving voltage line PL, and may be configured to store a voltage corresponding to a difference between a voltage received from the switching thin-film transistor T2 and a first power supply voltage ELVDD (or driving voltage) supplied to the driving voltage line PL.

The driving thin-film transistor T1 may be connected to the driving voltage line PL and the storage capacitor Cst, and may be configured to control a driving current flowing from the driving voltage line PL to the organic light-emitting diode OLED in response to a voltage value stored in the storage capacitor Cst. The organic light-emitting diode OLED may emit light having a certain luminance by the driving current.

FIG. 2A illustrates that the pixel circuit PC includes two thin-film transistors and one storage capacitor, but the inventive concepts are not limited thereto.

Referring to FIG. 2B, the pixel circuit PC may include the driving thin-film transistor T1, the switching thin-film transistor T2, and a sensing thin-film transistor T3, and the storage capacitor Cst.

The scan line SL may be connected to a gate electrode G2 of the switching thin-film transistor T2, the data line DL may be connected to a source electrode S2 of the switching thin-film transistor T2, and a first electrode CE1 of the storage capacitor Cst may be connected to a drain electrode D2 of the switching thin-film transistor T2.

Accordingly, the switching thin-film transistor T2 may be configured to supply a data voltage of the data line DL to a first node N in response to receiving the scan signal Sn from the scan line SL of each pixel P.

A gate electrode G1 of the driving thin-film transistor T1 may be connected to the first node N, a source electrode Si of the driving thin-film transistor T1 may be connected to the driving voltage line PL transmitting the driving voltage ELVDD, and a drain electrode D1 of the driving thin-film transistor T1 may be connected to an anode electrode of the organic light-emitting diode OLED.

Accordingly, the driving thin-film transistor T1 may be configured to adjust the amount of current flowing through the organic light-emitting diode OLED according to its source-gate voltage (Vgs), that is, a voltage applied between the driving voltage ELVDD and the first node N.

A sensing control line SSL may be connected to a gate electrode G3 of the sensing thin-film transistor T3, a source electrode S3 of the sensing thin-film transistor T3 may be connected to a second node S, and a drain electrode D3 of the sensing thin-film transistor T3 may be connected to a reference voltage line RL. In an embodiment, the sensing thin-film transistor T3 may be controlled by the scan line SL rather than the sensing control line SSL.

The sensing thin-film transistor T3 may sense a potential of a pixel electrode (e.g., is the anode electrode) of the organic light-emitting diode OLED. The sensing thin-film transistor T3 may be configured to supply a pre-charging voltage Vpre from the reference voltage line RL to the second node S in response to receiving a sensing signal SSn from the sensing control line SSL, or supply a voltage of the pixel electrode (e.g., the anode electrode) of the organic light-emitting diode OLED to the reference voltage line RL during a sensing period.

In the storage capacitor Cst, the first electrode CE1 may be connected to the first node N and a second electrode CE2 may be connected to the second node S. The storage capacitor Cst may be configured to charge a voltage corresponding to a difference between voltages supplied to the first and second nodes N and S, so as to supply the same as driving voltage of the driving thin-film transistor T1. For example, the storage capacitor Cst may be configured to charge a voltage corresponding to a difference between the data voltage and the pre-charging voltage Vpre respectively supplied to the first and second nodes N and S.

A bias electrode BSM may be formed to correspond to the driving thin-film transistor T1 to be connected to the source electrode S3 of the sensing thin-film transistor T3. As the bias electrode BSM is supplied with a voltage in connection with a potential of the source electrode S3 of the sensing thin-film transistor T3, the driving thin-film transistor T1 may be stabilized. In some exemplary embodiments, the bias electrode BSM may not be connected to the source electrode S3 of the sensing thin-film transistor T3, but may be connected to a separate bias wire.

An opposite electrode (e.g., a cathode electrode) of the organic light-emitting diode OLED may receive the common voltage ELVSS. The organic light-emitting diode OLED may receive a driving current from the driving thin-film transistor T1 to emit light.

FIG. 2B illustrates that each pixel P includes signal lines SL, SSL, and DL, a reference voltage line RL, and a driving voltage line PL, but the inventive concepts are not limited thereto. For example, at least one of the signal lines SL, SSL, and DL, and/or the reference voltage line RL, and the driving voltage line PL may be shared with neighboring pixels.

The pixel circuit PC is not limited to the number and circuit design of the thin-film transistors and the storage capacitor described with reference to FIGS. 2A and 2B, and the number and the circuit design thereof may be variously changed.

Figure 4:
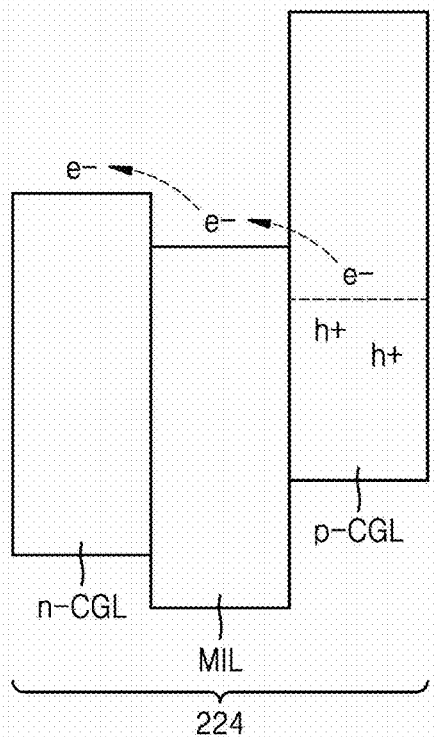
FIG. 4 illustrates an energy band diagram of a charge generation layer.
Figure 5A:
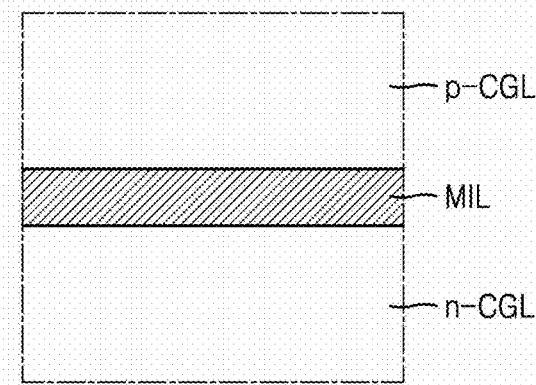
FIGS. 5A, 5B, and 5C are enlarged cross-sectional views of a portion of a charge generation layer according to embodiments.
Figure 5B:
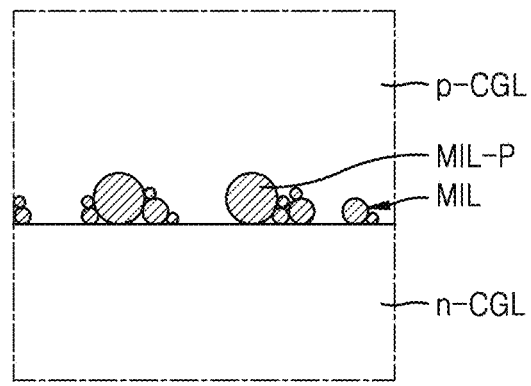
Figure 5C:
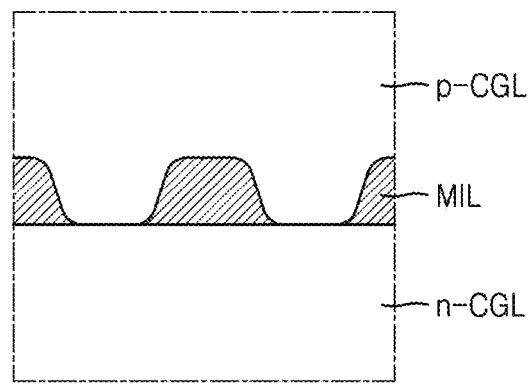

FIG. 3 is a schematic cross-sectional view of an organic light-emitting diode OLED which may be used in a display apparatus according to an embodiment. FIG. 4 illustrates an energy band diagram of a charge generation layer 224, and FIGS. 5A, 5B, and 5C are enlarged cross-sectional views of a portion of a charge generation layer according to embodiments.

Referring to FIG. 3, the organic light-emitting diode OLED, which is a light-emitting element, may be included in each pixel P (see FIG. 1A or 1B). The organic light-emitting diode OLED may be electrically connected to the pixel circuit PC shown in FIG. 2A or 2B, and may receive power or a signal through the pixel circuit PC to control the degree of light emission.

The organic light-emitting diode OLED may include a pixel electrode 210, an opposite electrode 230, and an interlayer 220 between the pixel electrode 210 and the opposite electrode 230. The pixel electrode 210 may be patterned and provided for each organic light-emitting diode OLED, and the opposite electrode 230 may be provided in an integrated form for a plurality of organic light-emitting diodes OLED.

In an embodiment, the organic light-emitting diode OLED may have a tandem structure including a stack of two or more emitting units. In an embodiment, the organic light-emitting diode OLED may include two emitting units of a first stack ST1 and a second stack ST2, as shown in FIG. 3. A first emission layer 222a and a second emission layer 222b may be arranged in the first stack ST1 and the second stack ST2, respectively. A charge generation layer 224 may be disposed between the first stack ST1 and the second stack ST2. Hereinafter, layers stacked on the pixel electrode 210 will be described in detail.

A first common layer 221 may be arranged on the pixel electrode 210. The first common layer 221 may function as a hole transport region. The first common layer 221 may include at least one layer selected from among a hole injection layer HIL, a hole transport layer HTL, an emission auxiliary layer, and an electron blocking layer. Thicknesses of the hole injection layer HIL, the hole transport layer HTL, the emission auxiliary layer, and the electron blocking layer may be independent of each other.

For example, the hole transport region may have a single-layer structure including a single layer including a plurality of different materials, or a multilayer structure of a hole injection layer/hole transport layer, a hole injection layer/hole transport layer/emission auxiliary layer, a hole injection layer/emission auxiliary layer, a hole transport layer/emission auxiliary layer, or a hole injection layer/hole transport layer/electron blocking layer sequentially stacked on a pixel electrode, without being limited thereto.

In an embodiment, the organic light-emitting diode OLED shown in FIG. 3 is illustrated as including the hole injection layer HIL and the hole transport layer HTL as a hole transport region, for example. The hole injection layer HIL may be arranged adjacent to the pixel electrode 210, and the hole transport layer HTL may be arranged on the hole injection layer HIL.

The hole injection layer HIL may facilitate injection of holes and may include one or more selected from the group consisting of hexaazatriphenylenehexacarbonitrile (HATCN) and cupper phthalocyanine (CuPC), poly(3,4)-ethylenedioxythiophene (PEDOT), polyaniline (PANI), and N, N-dinaphthyl-N, N'-diphenylbenzidine (NPD), but is not limited thereto.

The hole transport layer HTL may include a triphenylamine derivative having high hole mobility and excellent stability as a host of a hole transport layer, such as tris(4-carbazoyl-9-ylphenyl)amine (TCTA), N, N'-diphenyl-N,N'-bis(3-methylphenyl)-1,1'-bi-phenyl-4,4'-diamine) (TPD), or naphthalen-1-yl)-N,N'-diphenyl-benzidine (NPB). Although FIG. 3 illustrates that the hole transport layer HTL includes a single layer, in some exemplary embodiments, the hole transport layer HTL may have a multilayer structure. In this case, the hole transport layer HTL may have two or more layers including different materials among the above-described materials. For example, the hole transport layer HTL may be provided as two layers respectively including NPB and TCTA.

The first emission layer 222a may be arranged on the first common layer 221. The first emission layer 222a may include an organic material emitting one of red, blue, and green light. For example, when the first emission layer 222a emits red light, the first emission layer 222a may be formed by using, for example, a red dopant in a certain host material. Alternatively, when the first emission layer 222a emits green light, the first emission layer 222a may be formed by using, for example, a green dopant in a certain host material. Still alternatively, when the first emission layer 222a emits blue light, the first emission layer 222a may be formed by using, for example, a blue dopant in a certain host material.

An electron transport layer ETL may be arranged on the first emission layer 222a. The electron transport layer ETL arranged on the first emission layer 222a may provide substantially the same function as an electron transport layer ETL included in a second common layer 223.

The charge generation layer 224 may be arranged on the electron transport layer ETL. The charge generation layer 224 may be disposed between the first stack ST1 and the second stack ST2. The charge generation layer 224 may be disposed between the electron transport layer ETL and the hole transport layer HTL as shown in FIG. 3.

In an embodiment, the charge generation layer 224 may include an n-type charge generation layer n-CGL for supplying electrons to the first stack ST1, and a p-type charge generation layer p-CGL for supplying holes (h+) (see FIG. 4) to the second stack ST2. Also, a metal interlayer MTh may be disposed between the n-type charge generation layer n-CGL and the p-type charge generation layer p-CGL.

The n-type charge generation layer n-CGL may include an n-type dopant material and an n-type host material. In an embodiment, a volume ratio of the n-type host material and the n-type dopant material may be about 99:1 to about 90:10. The n-type dopant material may include a metal dopant, and the n-type host material may include an organic material, more particularly, an organic semiconductor material.

The n-type dopant material may be an organic material capable of injecting metals or electrons of Groups 1 and 2 in the periodic table, or a mixture thereof. For example, the n-type dopant material may include any one of an alkali metal and an alkaline earth metal. More particularly, the n-type charge generation layer n-CGL may include an organic layer doped with an alkali metal such as lithium (Li), sodium (Na), potassium (K), or cesium (Cs), or an alkaline earth metal such as magnesium (Mg), strontium (Sr), barium (Ba), radium (Ra), or ytterbium (Yb), but is not limited thereto. Alternatively, the n-type dopant material may include lanthanum rare earth elements. For example, the n-type dopant material may include any one of dysprosium (Dy), europium (Eu), and samarium (Sm). As the n-type dopant material, metal having a work function of less than −3 eV may be used.

The n-type host material may include a material capable of transmitting electrons, for example, at least one of tris (8-hydroxyquinolinato)aluminum ($Alq_3$), 8-hydroxyquinolinato-lithium (Liq), 2-(4-biphenylyl)-5-(4-tert-butylphenyl)-1,3,4 oxadiazole (PBD), 3-(4-biphenyl)4-phenyl-5-tert-butylphenyl-1,2,4-triazole (TAZ), Spiro-PBD, bis(2-methyl-8-quinolinolate)-4-(phenylphenolato)aluminum (BAlq), SAlq, 2,2',2-(1,3,5-benzinetriyl)-tris(1-phenyl-1-H-benzimidazole (TPBi), oxadiazole, triazole, phenanthroline, benzoxazole, or benzothiazole, but is not limited thereto.

The p-type charge generation layer p-CGL may include a p-type dopant material and a p-type host material. In an embodiment, a volume ratio of the p-type host material and the p-type dopant material may be about 99:1 to about 80:20. The p-type host material and the p-type dopant material may include organic materials. More particularly, the p-type host material may include a first organic semiconductor material, and the p-type dopant material may include a second organic semiconductor material or a metal material.

The p-type dopant material may include an organic material such as a metal oxide, tetrafluoro-tetracyanoquinodimethane (F4-TCNQ), hexaazatriphenylene-hexacarbonitrile (HAT-CN), hexaazatriphenylene, etc. or a metal material such as $V_2O_5$, MoOx, $WO_3$, etc. The p-type host material may include a material capable of transmitting holes, for example, a material including at least one of N,N-dinaphthyl-N,N'-diphenylbenzidine (NPD), N,N'-bis(naphthalen-1-yl)-N,N'-bis(phenyl)-2,2'-dimethylbenzidine, N,N'-bis-(3-methylphenyl)-N,N'-bis-(phenyl)-benzidine (TPD), and 4,4',4-tris(N-3-methylphenyl-N-phenyl-amino)-triphenylamine (MTDATA), but is not limited thereto.

Each of the n-type charge generation layer n-CGL and the p-type charge generation layer p-CGL may be formed to have a thickness of about 1 Å to about 200 Å. When the thicknesses of the n-type charge generation layer n-CGL and the p-type charge generation layer p-CGL satisfy the above-described range, charge transport characteristics may be secured without a substantial increase in driving voltage.

As such, as shown in FIG. 4, charge accumulation may occur at an interface between the n-type charge generation layer n-CGL and the p-type charge generation layer p-CGL due to a high energy barrier difference between a lowest unoccupied molecular orbital (LUMO) energy level of the n-type charge generation layer n-CGL and a highest occupied molecular orbital (HOMO) energy level of the p-type charge generation layer p-CGL. Accumulated electrons (e−) may cause degradation at the interface between the n-type charge generation layer n-CGL and the p-type charge generation layer p-CGL, which may cause problems such as an increase in the driving voltage and a decrease in the lifespan of the organic light-emitting diode OLED.

Accordingly, in the organic light-emitting diode OLED according to an embodiment, the metal interlayer MIL may be disposed between the n-type charge generation layer n-CGL and the p-type charge generation layer p-CGL. In this manner, a stepwise energy level is formed to facilitate movement of charges (e−), thereby effectively suppressing charge accumulation at the interface between the n-type charge generation layer n-CGL and the p-type charge generation layer p-CGL. Furthermore, a potential degradation inside the organic light-emitting diode OLED may be minimized or suppressed, thereby decreasing the driving voltage and improving the lifespan of the OLED.

A LUMO energy level of the metal interlayer MTh may have a value between the LUMO energy level of the n-type charge generation layer n-CGL and the HOMO energy level of the p-type charge generation layer p-CGL. An absolute value (not a negative value itself) of energy level may gradually decrease in the order of a HOMO energy level of a p-type charge generation layer p-CGL, a LUMO energy level of a metal interlayer MIL, and a LUMO energy level of a n-type charge generation layer n-CGL, which are adjacently disposed one over another.

In an embodiment, the metal interlayer MIL may include metal having a work function of about −6.0 eV to about −3.5 eV. In an embodiment, the metal interlayer MIL may include at least one of bismuth (Bi), Mg, and zinc (Zn). Also, the metal interlayer MIL may include an alkaline earth, a transition metal, or a post-transition metal including at least one of Bi, Mg, and Zn. For example, a work function of Bi may be about −4.34 eV, a work function of Mg may be about −3.66 eV, and a work function of Zn may be about −3.63 eV to about −4.9 eV. In this manner, a stepwise energy level may be formed between the LUMO energy level of the n-type charge generation layer n-CGL and the HOMO energy level of the p-type charge generation layer p-CGL.

The metal interlayer MTh including Bi, Mg, or Zn may not refer that the above-described metals are included as dopants or additives in an organic material, but rather that the metal layer is formed with the above-described metals.

The metal interlayer MTh may be formed to have a thickness of about 1 Å to about 100 Å. The metal interlayer MIL may be formed thinner than the n-type charge generation layer n-CGL and the p-type charge generation layer p-CGL. When the metal interlayer MTh is formed to have a thickness of less than 1 Å, the metal interlayer MTh may not properly perform its function. When the metal interlayer MTh is formed to have a thickness of more than 100 Å, the amount of light absorbed by the metal interlayer MTh may be increased and reduce the amount of light emitted through the organic light-emitting diode OLED. As described above, the metal interlayer MTh includes a reflective metal material, and thus, when the metal interlayer MTh is formed to have a thickness of more than 100 Å, the luminous power of the organic light-emitting diode OLED itself may be reduced.

FIGS. 5A to 5C illustrate the shape of the metal interlayer MTh according to embodiments.

The metal interlayer MTh may be formed by spraying metal nanoparticles onto the n-type charge generation layer n-CGL and depositing the same. In this process, the metal interlayer MIL may have shapes as shown in FIGS. 5A to 5C depending on a process condition.

In an embodiment, the metal interlayer MIL may be provided as a single layer as shown in FIG. 5A. Alternatively, the metal interlayer MTh may be provided in the form including metal particles MIL-P each having a size of several nanometers to tens of nanometers as shown in FIG. 5B. The metal particles MIL-P may be formed on a front surface of the n-type charge generation layer n-CGL, and may have the form of a single layer having an approximately constant thickness as shown in FIG. 5A, or have the form in which metal particles MIL-P are dispersed in some regions on the n-type charge generation layer n-CGL or some metal particles MIL-P are aggregated as shown in FIG. 5B. Also, as shown in FIG. 5C, the metal interlayer MIL may be formed only in some regions on the n-type charge generation layer n-CGL. In the case shown in FIG. 5B or 5C, the n-type charge generation layer n-CGL and the p-type charge generation layer p-CGL may be in contact with each other in at least some regions with the metal interlayer MTh therebetween. Also, in the case of FIG. 5B or 5C, a stepwise energy level may be formed by the metal interlayer MIL, and light absorption by the metal interlayer MIL may be minimized.

Referring back to FIG. 3, the hole transport layer HTL may be arranged on the charge generation layer 224. The hole transport layer HTL may provide substantially the same function as the hole transport layer HTL of the first common layer 221.

The second emission layer 222b may be arranged on the hole transport layer HTL. The second emission layer 222b may include an organic material emitting one of red, blue, and green light. For example, when the second emission layer 222b emits red light, the second emission layer 222b may be formed by using, for example, a red dopant in a certain host material. Alternatively, when the second emission layer 222b emits green light, the second emission layer 222b may be formed by using, for example, a green dopant in a certain host material. Still alternatively, when the second emission layer 222b emits blue light, the second emission layer 222b may be formed by using, for example, a blue dopant in a certain host material.

In an embodiment, the first emission layer 222a and the second emission layer 222b may emit light having the same wavelength or may emit light having different wavelengths.

For example, both the first emission layer 222a and the second emission layer 222b may emit blue light. Alternatively, the first emission layer 222a may emit blue light and the second emission layer 222b may emit green light. However, the inventive concepts are not limited thereto.

The second common layer 223 may be arranged on the second emission layer 222b. The second common layer 223 may function as an electron transport region. The second common layer 223 may include at least one layer selected from among a buffer layer, a hole blocking layer, an electron control layer, an electron transport layer ETL, and an electron injection layer EIL. Thicknesses of the buffer layer, the hole blocking layer, the electron control layer, the electron transport layer ETL, and the electron injection layer EIL may be independent of each other.

For example, the electron transport region may have a single-layer structure including a single layer including a plurality of different materials, or a multilayer structure of an electron transport layer/electron injection layer, a hole blocking layer/electron transport layer/electron injection layer, an electron control layer/electron transport layer/electron injection layer, or a buffer layer/electron transport layer/electron injection layer sequentially stacked from an emission layer, but is not limited thereto.

In an embodiment, the organic light-emitting diode OLED is illustrated as including the electron injection layer EIL and the electron transport layer ETL as an electron transport region in FIG. 3. The electron injection layer EIL may be arranged adjacent to the opposite electrode 230, and the electron transport layer ETL may be arranged on the second emission layer 222b.

The electron transport layer ETL may facilitate transport of electrons and may include one or more selected from the group consisting of tris(8-hydroxyquinolinato)aluminum (Alq$_3$), PBD, TAZ, Spiro-PBD, BAlq, lithium quinolate (Liq), BMB-3T, PF-6P, TPBI, COT, and SAlq, but is not limited thereto.

The electron injection layer EIL may facilitate injection of electrons and may use Yb, tris(8-hydroxyquinolinato)aluminum (Alq$_3$), PBD, TAZ, Spiro-PBD, BAlq, or SAlq, but is not limited thereto.

FIG. 3 illustrates that the organic light-emitting diode OLED includes all of the hole injection layer HIL, the hole transport layer HTL, the electron transport layer ETL, and the electron injection layer EIL, but the inventive concepts are not limited thereto. In another embodiment, at least one of the hole injection layer HIL, the hole transport layer HTL, the electron transport layer ETL, and the electron injection layer EIL may be omitted.

Other layers except for the first emission layer 222a and the second emission layer 222b, for example, the hole injection layer HIL, the hole transport layer HTL, the electron transport layer ETL, the electron injection layer EIL, and the charge generation layer 224, may be provided as one body over a plurality of organic light-emitting diodes OLED.

Figure 7:
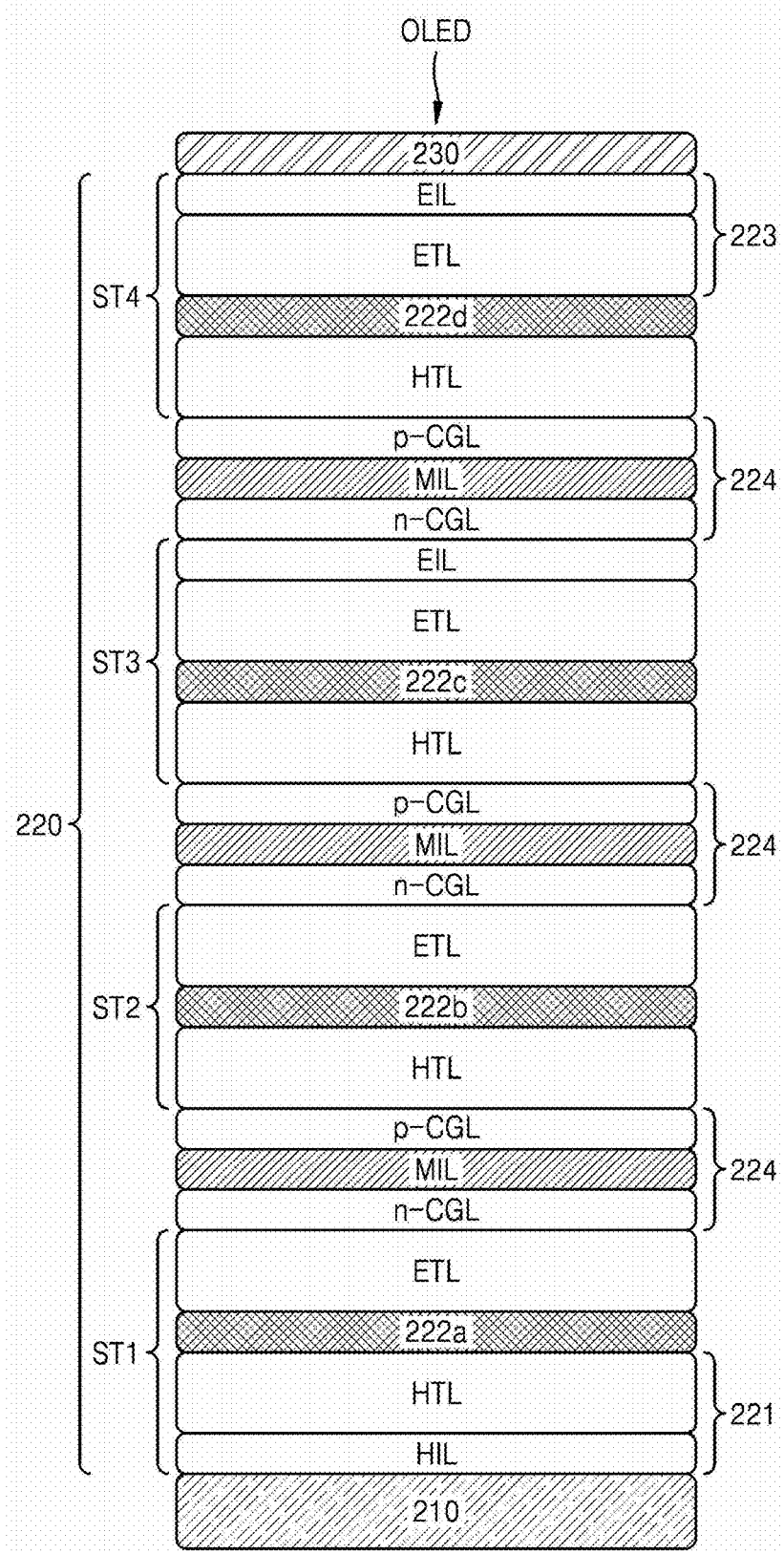

FIGS. 6 and 7 are schematic cross-sectional views of an organic light-emitting diode OLED which may be used in a display apparatus according to embodiments.

Referring to FIG. 6, the organic light-emitting diode OLED may have a tandem structure including a stack of three or more emitting units. In an embodiment, the organic light-emitting diode OLED may include three emitting units of a first stack ST1, a second stack ST2, and a third stack ST3, as shown in FIG. 6. First to third emission layers 222a, 222b, and 222c may be arranged in the first to third stacks ST1 to ST3, respectively. Also, charge generation layers 224 may be between the first stack ST1 and the second stack ST2 and between the second stack ST2 and the third stack ST3, respectively.

Referring to FIG. 7, the organic light-emitting diode OLED may have a tandem structure including a stack of four or more emitting units. In an embodiment, the organic light-emitting diode OLED may include four emitting units of a first stack ST1, a second stack ST2, a third stack ST3, and a fourth stack ST4, as shown in FIG. 7. First to fourth emission layers 222a, 222b, 222c, and 222d may be arranged in the first to fourth stacks ST1 to ST4, respectively. Also, charge generation layers 224 may be between the first stack ST1 and the second stack ST2, between the second stack ST2 and the third stack ST3, and between the third stack ST3 and the fourth stack ST4, respectively.

In a stacked structure of the interlayer 220 arranged between the pixel electrode 210 and the opposite electrode 230, layers indicated by the same reference numeral may refer to the same layer described above with reference to FIG. 3. As such, repeated descriptions of the same elements will be omitted, and differences from those shown in FIG. 3 will be mainly described.

Referring to FIG. 6 or 7, the organic light-emitting diode OLED may have a tandem structure including a stack of 'm' or more emitting units, in which 'm' is an integer greater than or equal to 2. In this case, 'm−1' charge generation layers 224 may be disposed between the stacks.

The charge generation layer 224 may include an n-type charge generation layer n-CGL, a p-type charge generation layer p-CGL, and a metal interlayer MTh therebetween. The charge generation layer 224 has to include the n-type charge generation layer n-CGL and the p-type charge generation layer p-CGL, and may optionally include the metal interlayer MIL. FIG. 6 or 7 illustrates that all of the charge generation layers 224 include a metal interlayer MIL, but the inventive concepts are not limited thereto. In an embodiment, at least one of the 'm−1' charge generation layers 224 may include a metal interlayer MTh.

The organic light-emitting diode OLED shown in FIG. 6 may emit red, blue, green, or white light. The organic light-emitting diode OLED includes the first to third emission layers 222a to 222c, and the first to third emission layers 222a to 222c may include an organic material emitting one of red, blue, and green light. The first to third emission layers 222a to 222c may emit light having the same wavelength, or at least one or more of the first to third emission layers 222a to 222c may emit light having different wavelengths. For example, all of the first to third emission layers 222a to 222c may emit blue light. Alternatively, the first emission layer 222a and the second emission layer 222b may emit blue light, and the third emission layer 222c may emit green light.

Similarly, the organic light-emitting diode OLED shown in FIG. 7 may emit red, blue, green, or white light. The organic light-emitting diode OLED includes the first to fourth emission layers 222a to 222d, and the first to fourth emission layers 222a to 222d may include an organic material emitting one of red, blue, and green light. The first to fourth emission layers 222a to 222d may emit light having the same wavelength, or at least one or more of the first to fourth emission layers 222a to 222d may emit light having different wavelengths. For example, all of the first to fourth emission layers 222a to 222d may emit blue light. Alternatively, the first to third emission layers 222a to 222c may emit blue light, and the fourth emission layer 222d may emit green light.

Figure 8:
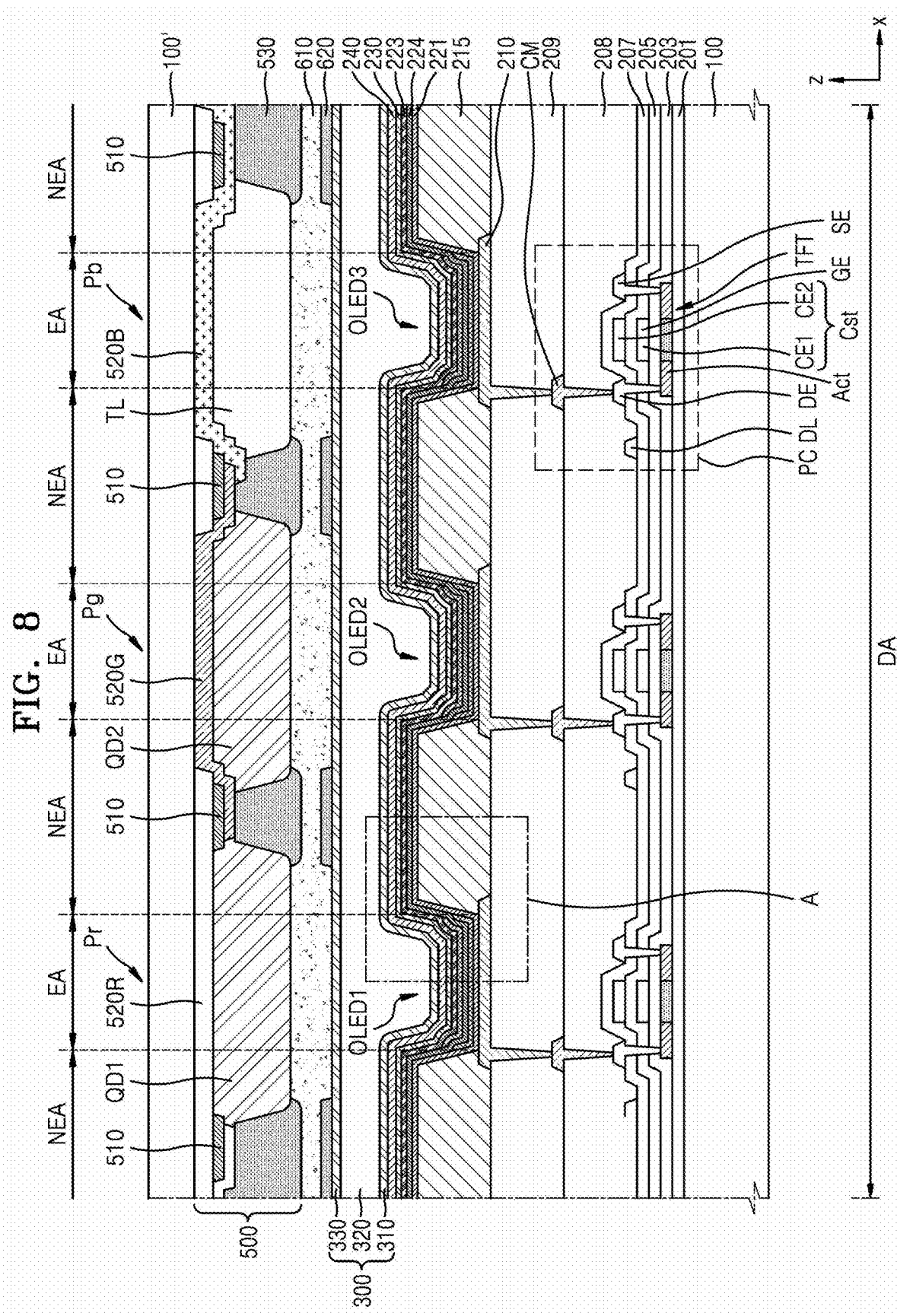
FIG. 8 is a schematic cross-sectional view of a portion of a display apparatus according to an embodiment.
Figure 9:
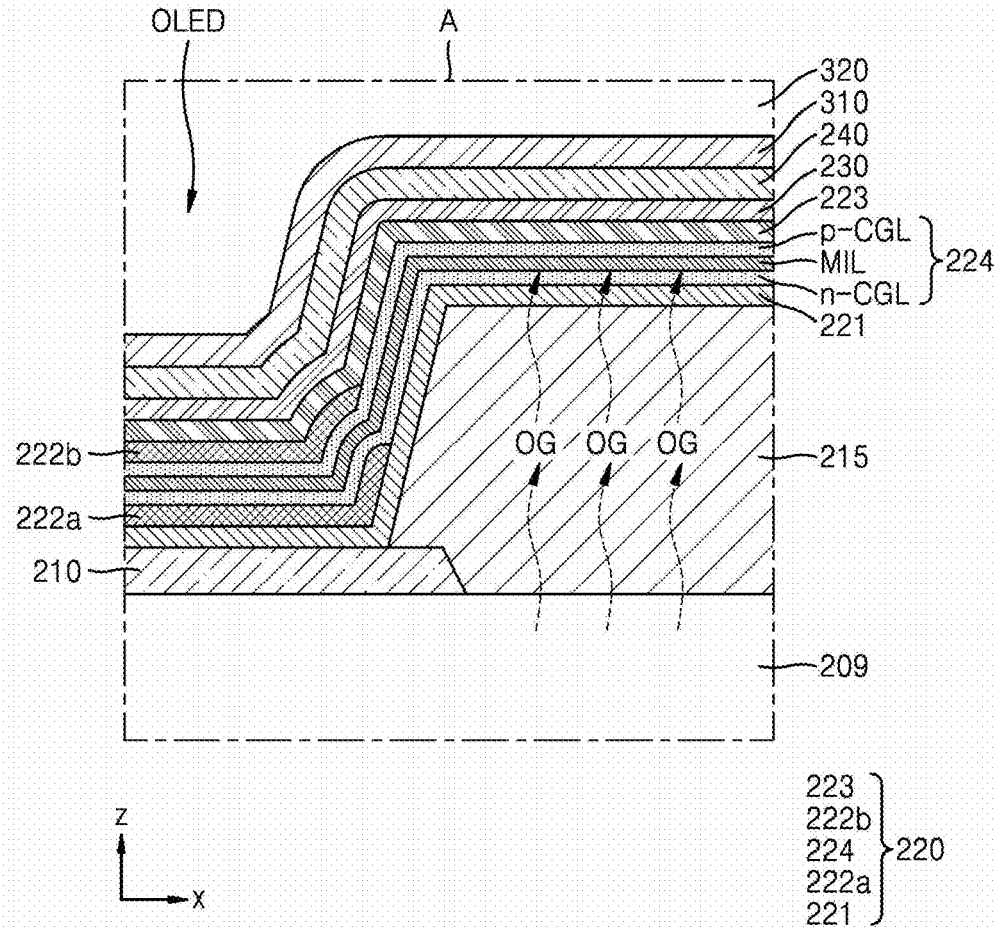
FIG. 9 is a schematic enlarged cross-sectional view of a portion of an organic light-emitting diode of FIG. 8.

FIG. 8 is a schematic cross-sectional view of a portion of a display apparatus according to an embodiment, and FIG. 9 is a schematic enlarged cross-sectional view of a portion of an organic light-emitting diode OLED of FIG. 8.

Referring to FIG. 8, first to third pixels Pr, Pg, and Pb may be arranged on the substrate 100. Each of the first to third pixels Pr, Pg, and Pb includes respective first to third organic light-emitting diodes OLED1, OLED2, and OLED3 and a pixel circuit PC, and is electrically connected to the pixel circuit PC, so that light emission may be controlled. The pixel circuits PC included in the first to third pixels Pr, Pg, and Pb have the same structure, and thus, a stacked structure will be mainly described with reference to one pixel.

The substrate 100 may include a glass material or a polymer resin. In an embodiment, the substrate 100 may include a plurality of sub-layers. The sub-layers may have a structure in which an organic layer and an inorganic layer are alternately stacked. When the substrate 100 includes a polymer resin, the substrate 100 may include polyethersulfone, polyacrylate, polyetherimide, polyethylene naphthalate, polyethylene terephthalate, polyphenylene sulfide, polyarylate, polyimide, polycarbonate, or cellulose acetate propionate.

A display layer including a display element such as an OLED, and a thin-film encapsulation layer (not shown) covering the display layer may be arranged on the substrate 100. Hereinafter, the display layer will be described in detail.

A buffer layer 201 may be formed on the substrate 100 to prevent impurities from penetrating into a semiconductor layer Act of a thin-film transistor TFT. The buffer layer 201 may include an inorganic insulating material, such as silicon nitride, silicon oxide, and silicon oxynitride, and may be provided as a single layer or multilayer including the inorganic insulating material.

The pixel circuit PC may be arranged on the buffer layer 201. The pixel circuit PC may be arranged to correspond to each pixel P. The pixel circuit PC includes the thin-film transistor TFT and a storage capacitor Cst. The thin-film transistor TFT may include the semiconductor layer Act, a gate electrode GE, a source electrode SE, and a drain electrode DE.

Although not shown in FIG. 8, a data line DL of the pixel circuit PC may be electrically connected to a switching thin-film transistor included in the pixel circuit PC. While FIG. 8 illustrates a top-gate type thin-film transistor TFT in which the gate electrode GE is arranged over the semiconductor layer Act with a gate insulating layer 203 therebetween, the thin-film transistor TFT may include a bottom-gate type thin-film transistor in another embodiment.

The semiconductor layer Act may include an oxide semiconductor. Alternatively, the semiconductor layer Act may include amorphous silicon, polysilicon, an organic semiconductor, or the like.

The gate electrode GE may include a low resistance metal material. The gate electrode GE may include a conductive material including molybdenum (Mo), aluminum (Al), copper (Cu), and titanium (Ti), and may be provided as a single layer or multilayer including the above material.

The gate insulating layer 203 disposed between the semiconductor layer Act and the gate electrode GE may include an inorganic insulating material, such as silicon oxide, silicon oxynitride, silicon nitride, aluminum oxide, titanium oxide, tantalum oxide, and hafnium oxide. The gate insulating layer 203 may be provided as a single layer or multilayer including the above-described material.

The source electrode SE and the drain electrode DE may be located on the same layer as the data line DL and may include the same material. The source electrode SE, the drain electrode DE, and the data line DL may include a material having excellent conductivity. The source electrode SE and the drain electrode DE may include a conductive material including Mo, Al, Cu, and Ti, and may be provided as a single layer or multilayer including the above material. For example, the source electrode SE, the drain electrode DE, and the data line DL may include a multilayer of Ti/Al/Ti.

The storage capacitor Cst may include a first electrode CE1 and a second electrode CE2 overlapping each other with a first interlayer insulating layer 205 therebetween. The storage capacitor Cst may overlap the thin-film transistor TFT. In this regard, the gate electrode GE of the thin-film transistor TFT shown in FIG. 8 may function as the first electrode CE1 of the storage capacitor Cst. In another embodiment, the storage capacitor Cst may not overlap the thin-film transistor TFT. In this case, the storage capacitor Cst may be covered with a second interlayer insulating layer 207. The second electrode CE2 of the storage capacitor Cst may include a conductive material including Mo, Al, Cu, and Ti, and may be provided as a single layer or multilayer including the above material.

The first interlayer insulating layer 205 and the second interlayer insulating layer 207 may include an inorganic insulating material, such as silicon oxide, silicon oxynitride, silicon nitride, aluminum oxide, titanium oxide, tantalum oxide, and hafnium oxide. The first interlayer insulating layer 205 and the second interlayer insulating layer 207 may be provided as a single layer or multilayer including the above material.

The pixel circuit PC including the thin-film transistor TFT and the storage capacitor Cst may be covered with a first planarization insulating layer 208. An upper surface of the first planarization insulating layer 208 may have an approximately flat surface.

Although not shown, a third interlayer insulating layer (not shown) may be further arranged under the first planarization insulating layer 208. The third interlayer insulating layer may include an inorganic insulating material, such as silicon oxide, silicon nitride, or silicon oxynitride.

The pixel circuit PC may be electrically connected to a pixel electrode 210. For example, as shown in FIG. 8, a contact metal layer CM may be disposed between the thin-film transistor TFT and the pixel electrode 210. The contact metal layer CM may be connected to the thin-film transistor TFT through a contact hole formed in the first planarization insulating layer 208, and the pixel electrode 210 may be connected to the contact metal layer CM through a contact hole formed in a second planarization insulating layer 209 on the contact metal layer CM. The contact metal layer CM may include a conductive material including Mo, Al, Cu, and Ti, and may be provided as a single layer or multilayer including the above material. In an embodiment, the contact metal layer CM may include a multilayer of Ti/Al/Ti.

The first planarization insulating layer 208 and the second planarization insulating layer 209 may include an organic insulating material such as a general-purpose polymer, such as polymethylmethacrylate (PMMA) or polystyrene (PS), polymer derivatives having a phenol-based group, an acrylic polymer, an imide-based polymer, an aryl ether-based polymer, an amide-based polymer, a fluorine-based polymer, a p-xylene-based polymer, a vinyl alcohol-based polymer, or a blend thereof. In an embodiment, the first planarization insulating layer 208 and the second planarization insulating layer 209 may include polyimide.

Referring to FIGS. 8 and 9 together, the first to third organic light-emitting diodes OLED1, OLED2, and OLED3 may be arranged on the second planarization insulating layer 209. For example, each of the first to third organic light-emitting diodes OLED1, OLED2, and OLED3 may include a pixel electrode 210, a first common layer 221, a first emission layer 222a, a charge generation layer 224, a second emission layer 222b, a second common layer 223, and an opposite electrode 230. In the first to third organic light-emitting diodes OLED1, OLED2, and OLED3, the pixel electrode 210, the first emission layer 222a, and the second emission layer 222b are patterned and provided for each pixel, and the first common layer 221, the second common layer 223, the charge generation layer 224, and the opposite electrode 230 may be provided as one body in a display area.

In FIG. 8, the first to third organic light-emitting diodes OLED1, OLED2, and OLED3 according to an embodiment may have the stacked structure described above with reference to FIG. 3 is used as an example. However, the inventive concepts are not limited thereto, and in some embodiments, the first to third organic light-emitting diodes OLED1, OLED2, and OLED3, may have the stacked structure shown in FIG. 6 or 7.

The pixel electrode 210 may include a conductive oxide such as indium tin oxide (ITO), indium zinc oxide (IZO), zinc oxide (ZnO), indium oxide ($In_2O_3$), indium gallium oxide (IGO), or aluminum zinc oxide (AZO). In another embodiment, the pixel electrode 210 may include a reflective layer including Ag, Mg, Al, Pt, Pd, Au, Ni, Nd, Ir, Cr, or a compound thereof. In another embodiment, the pixel electrode 210 may further include a film including ITO, IZO, ZnO, or $In_2O_3$ over and/or under the reflective layer.

A pixel-defining layer 215 may be formed on the pixel electrode 210. The pixel-defining layer 215 may include an opening exposing an upper surface of the pixel electrode 210 and cover edges of the pixel electrode 210. The pixel-defining layer 215 may include an organic insulating material. Alternatively, the pixel-defining layer 215 may include an inorganic insulating material, such as a silicon nitride, a silicon oxynitride, or a silicon oxide. Still alternatively, the pixel-defining layer 215 may include an organic insulating material and an inorganic insulating material.

The interlayer 220 includes two or more emission layers (e.g., the first emission layer 222a and the second emission layer 222b). Each of the first emission layer 222a and the second emission layer 222b may include a polymer organic material or a low-molecular weight organic material to emit light having a certain color.

Also, the interlayer 220 may include the first common layer 221 between the first emission layer 222a and the pixel electrode 210 and/or the second common layer 223 between the second emission layer 222b and the opposite electrode 230.

The first common layer 221 may be provided as a single layer or a multilayer. For example, when the first common layer 221 includes a polymer material, the first common layer 221 may include a hole transport layer (HTL), which has a single-layer structure, and include PEDOT or polyaniline (PAN). When the first common layer 221 includes a low-molecular weight material, the first common layer 221 may include a hole injection layer (HIL) and an HTL.

In some embodiments, the second common layer 223 may be omitted. For example, when the first common layer 221, the first emission layer 222a, and the second emission layer 222b include a polymer material, the second common layer 223 may be formed as a single layer or a multilayer. The second common layer 223 may include an electron transport layer (ETL) and/or an electron injection layer (EIL).

The charge generation layer 224 may be disposed between the first emission layer 222a and the second emission layer 222b. The charge generation layer 224 may include the n-type charge generation layer n-CGL, the p-type charge generation layer p-CGL, and the metal interlayer MIL therebetween.

Referring to FIG. 9, among the layers arranged under the organic light-emitting diode OLED, outgas OG may be generated in an organic insulating layer, for example, the second planarization insulating layer 209. The outgas OG may cause pixel shrinkage, and may react with an opposite electrode 230 arranged in a direction in which the outgas OG travels and oxide the opposite electrode 230.

In the organic light-emitting diode OLED according to an embodiment, the metal interlayer MTh provided in the charge generation layer 224 preferentially collects outgas OG generated under the metal interlayer MIL, so as to minimize the pixel shrinkage and prevent oxidation of the organic light-emitting diode OLED.

The opposite electrode 230 may include a conductive material having a low work function. For example, the opposite electrode 230 may include a (semi-)transparent layer including silver (Ag), Mg, Al, platinum (Pt), palladium (Pd), gold (Au), nickel (Ni), neodymium (Nd), iridium (Ir), chromium (Cr), Li, calcium (Ca), or an alloy thereof. Alternatively, the opposite electrode 230 may further include a layer including ITO, IZO, ZnO, or $In_2O_3$ on the (semi-)transparent layer including the above-described material.

The first common layer 221, the second common layer 223, and the opposite electrode 230 may be formed on a front surface of the substrate 100 by using a thermal deposition method.

In some embodiments, a capping layer 240 may be located on the opposite electrode 230. For example, the capping layer 240 may be provided as a single layer or multilayer including a material selected from among an organic material, an inorganic material, and a mixture thereof. In an optional embodiment, a lithium fluoride (LiF) may be located on the capping layer 240.

As the first to third organic light-emitting diodes OLED1, OLED2, and OLED3 may be easily damaged by external moisture or oxygen, a thin-film encapsulation layer 300 may cover and protect the first to third organic light-emitting diodes OLED1, OLED2, and OLED3. The thin-film encapsulation layer 300 may cover the display area DA and extend to a non-display area outside the display area DA. The thin-film encapsulation layer 300 may include at least one organic encapsulation layer and at least one inorganic encapsulation layer. For example, the thin-film encapsulation layer 300 may include a first inorganic encapsulation layer 310, an organic encapsulation layer 320, and a second inorganic encapsulation layer 330.

The first inorganic encapsulation layer 310 may cover the opposite electrode 230 and may include silicon oxide, silicon nitride, and/or silicon oxynitride. Although not shown, when necessary, other layers such as a capping layer or the like may be disposed between the first inorganic encapsulation layer 310 and the opposite electrode 230. Since the first inorganic encapsulation layer 310 is formed along an underlying structure thereof, an upper surface of the first inorganic encapsulation layer 310 may not be flat. As such, the organic encapsulation layer 320 may cover the first inorganic encapsulation layer 310. In this manner, an upper surface of the organic encapsulation layer 320 may be substantially flat, unlike the first inorganic encapsulation layer 310. In detail, the upper surface of the organic encapsulation layer 320 may be substantially flat in a portion corresponding to the display area DA. The organic encapsulation layer 320 may include one or more materials selected from the group consisting of polyethylene terephthalate, polyethylene naphthalate, polycarbonate, polyimide, polyethylene sulfonate, polyoxymethylene, polyarylate, hexamethyldisiloxane, and acrylic resin (e.g., polymethyl methacrylate, polyacrylic acid, etc.). The second inorganic encapsulation layer 330 may cover the organic encapsulation layer 320 and may include silicon oxide, silicon nitride, and/or silicon oxynitride.

Even when the thin-film encapsulation layer 300 cracks, the above-described multilayer structure of the thin-film encapsulation layer 300 may prevent the cracks from being connected between the first inorganic encapsulation layer 310 and the organic encapsulation layer 320 or between the organic encapsulation layer 320 and the second inorganic encapsulation layer 330. As such, the formation of a passage through which external moisture or oxygen penetrates into the display area DA may be prevented or minimized.

A filler 610 may be arranged on the thin-film encapsulation layer 300. The filler 610 may function as a buffer against external pressure or the like. The filler 610 may include an organic material, such as methyl silicone, phenyl silicone, or polyimide. However, the inventive concepts are not limited thereto, and the filler 610 may include an organic sealant such as a urethane-based resin, an epoxy-based resin, or an acrylic resin, or an inorganic sealant such as silicon.

A light-shielding layer 620 may be arranged on the thin-film encapsulation layer 300. The light-shielding layer 620 may be directly arranged on the second inorganic encapsulation layer 330 of the thin-film encapsulation layer 300. The light-shielding layer 620 may be arranged to correspond to a black matrix 510 to be described below, and may include a light-shielding material that may be used in the black matrix 510.

An anti-reflective layer 500 may be provided under the upper substrate 100' arranged to face the substrate 100 with the filler 610 therebetween. The anti-reflective layer 500 may include the black matrix 510, a color filter 520, first and second color conversion layers QD1 and QD2, a transmission layer TL, and a partition wall 530.

Each of the color conversion layers QD1 and QD2 may include quantum dots. The quantum dots exhibit excitation and emission characteristics according to their material and size, and thus, may convert incident light into light having a certain color. Various materials may be used as the quantum dots.

In an embodiment, the quantum dots may have a core-shell structure including a core including nanocrystals and a shell surrounding the core. The core of quantum dots may be selected from among a Group II-VI compound, a Group III-V compound, a IV-VI compound, a Group IV element, a Group IV compound, and a combination thereof.

The Group II-VI compound may be selected from the group consisting of a binary compound selected from the group consisting of CdSe, CdTe, ZnS, ZnSe, ZnTe, ZnO, HgS, HgSe, HgTe, MgSe, MgS, and a mixture thereof, a ternary compound selected from the group consisting of AgInS, CuInS, CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, MgZnS, and a mixture thereof, and a quaternary compound selected from the group consisting of HgZnTeS, CdZnSeS, CdZnSeTe, CdZnSTe, CdHgSeS, CdHgSeTe, CdHgSTe, HgZnSeS, HgZnSeTe, HgZnSTe, and a mixture thereof.

The Group III-VI compound may be selected from the group consisting of a binary compound selected from the group consisting of GaN, GaP, GaAs, GaSb, AlN, AlP, AlAs, AlSb, InN, InP, InAs, InSb, and a mixture thereof, a ternary compound selected from the group consisting of GaNP, GaNAs, GaNSb, GaPAs, GaPSb, AlNP, AlNAs, AlNSb, AlPAs, AlPSb, InGaP, InNP, InNAs, InNSb, InPAs, InPSb, GaAlNP, and a mixture thereof, and a quaternary compound selected from the group consisting of GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, and a mixture thereof.

The Group IV-VI compound may be selected from the group consisting of a binary compound selected from the group consisting of SnS, SnSe, SnTe, PbS, PbSe, PbTe, and a mixture thereof, a ternary compound selected from the group consisting of SnSeS, SnSeTe, SnSTe, PbSeS, PbSeTe, PbSTe, SnPbS, SnPbSe, SnPbTe, and a mixture thereof, and a quaternary compound selected from the group consisting of SnPbSSe, SnPbSeTe, SnPbSTe, and a mixture thereof. The Group IV element may be selected from the group consisting of Si, Ge, and a mixture thereof. The Group IV compound may be a binary compound selected from the group consisting of SiC, SiGe, and a mixture thereof.

In this case, the binary compound, the ternary compound, or the quaternary compound may be present in a particle at a uniform concentration, or may be present in the same particle as the concentration distribution is divided into partially different states. In addition, the quantum dots may have a core-shell structure in which one quantum dot surrounds another quantum dot. An interface between the core and the shell may have a concentration gradient, in which an element concentration in the shell gradually decreases toward the center.

The shell of the quantum dot may function as a protective layer for maintaining semiconductor characteristics by preventing chemical transformation of the core and/or as a charging layer for imparting electrophoretic characteristics to the quantum dots. The shell may be provided as a single layer or a multilayer. An interface between the core and the shell may have a concentration gradient in which an element concentration in the shell gradually decreases toward the center. The shell of the quantum dot may include a metal or non-metal oxide, a semiconductor compound, or a combination thereof.

For example, the metal or non-metal oxide may include a binary compound such as $SiO_2$, $Al_2O_3$, $TiO_2$, ZnO, MnO, $Mn_2O_3$, $Mn_3O_4$, CuO, FeO, $Fe_2O_3$, $Fe_3O_4$, CoO, $Co_3O_4$, NiO, etc. or a ternary compound such as $MgAl_2O_4$, $CoFe_2O_4$, $NiFe_2O_4$, $CoMn_2O_4$, etc., but the inventive concepts are not limited thereto.

In addition, the semiconductor compound may include CdS, CdSe, CdTe, ZnS, ZnSe, ZnTe, ZnSeS, ZnTeS, GaAs, GaP, GaSb, HgS, HgSe, HgTe, InAs, InP, InGaP, InSb, AlAs, AlP, AlSb, etc., but the inventive concepts are not limited thereto.

The full width of half maximum (FWHM) of an emission wavelength spectrum of the quantum dots may be about 45 nm or less, preferably about 40 nm or less, and more preferably about 30 nm or less, to improve color purity or color reproducibility. In addition, light emitted through these quantum dots is emitted in all directions, and thus, an optical field of view may be improved.

In addition, the quantum dots may have the forms generally known in the art. For example, the quantum dots may have the forms of spherical, pyramidal, multi-arm, or cubic nanoparticles, nanotubes, nanowires, nanofibers, or nano-plate-shaped particles.

The quantum dots may adjust a color of emitted light according to a particle size, and thus, the quantum dots may have various emission colors such as blue, red, green, etc.

The core of the quantum dots may have a diameter of about 2 nm to about 10 nm. When the quantum dots are exposed to light, the quantum dots may emit light having a specific wavelength depending on the size of particles and the type of material. As such, an average size of quantum dots included in the first color conversion layer QD1 may be different from an average size of quantum dots included in the second color conversion layer QD2. For example, as the size of the quantum dots increases, light having a color with a longer wavelength may be emitted. Accordingly, the size of the quantum dots may be selected b according to the colors of the first pixel Pr and the second pixel Pg.

In addition to the quantum dots, the first and second color conversion layers QD1 and QD2 may further include various materials so that the quantum dots are mixed and appropriately dispersed. For example, the first and second color conversion layers QD1 and QD2 may include scattering particles, a solvent, a photo-initiator, a binder polymer, a dispersant, and the like.

The third pixel Pb may not include a color conversion layer in an emission area thereof, but a transmission layer TL may be arranged therein. The transmission layer TL may include an organic material through which light may be emitted without conversion of a wavelength of light emitted from the third organic light-emitting diode OLED3 of the third pixel Pb. The transmission layer TL may include scattering particles for uniform color spreadability. In this case, the scattering particles may have a diameter in a range of about 200 nm to about 400 nm.

In the illustrated embodiment, the first organic light-emitting diode OLED1 and the second organic light-emitting diode OLED2 respectively included in the first pixel Pr and the second pixel Pg may emit light having the same wavelength, and colors of the first pixel Pr and the second pixel Pg may be determined according to colors of light emitted by the quantum dots of the first color conversion layer QD1 and the quantum dots of the second color conversion layer QD2, respectively.

Since the third pixel Pb does not include the color conversion layer in the emission area EA thereof, a color of light emitted by the third pixel Pb may be determined according to a color of light emitted by the third organic light-emitting diode OLED3. For example, the first pixel Pr may implement red light, the second pixel Pg may implement green light, and the third pixel Pb may implement blue light.

The partition wall 530 may be disposed between the first color conversion layer QD1 and the second color conversion layer QD2, and between the second color conversion layer QD2 and the transmission layer TL to correspond to a non-emission area NEA. In detail, the partition wall 530 may be disposed between the first color conversion layer QD1 and the second color conversion layer QD2, and between the second color conversion layer QD2 and the transmission layer TL.

The partition wall 530 may include an organic material, and a material to control optical density, such as CR or $CrO_x$, $Cr/CrO_x$, $Cr/CrO_x/CrN_y$, resin (carbon pigment, RGB mixed pigment, etc.), graphite, or a non-Cr-based material. Alternatively, the partition wall 530 may include a pigment having a red, green, or yellow color. The partition wall 530 may function as a black matrix to prevent color mixing and improve visibility.

First to third color filters 520R, 520G, and 520B and the black matrix 510 may be provided between the upper substrate 100', and the first and second color conversion layers QD1 and QD2 and the transmission layer TL.

The first to third color filters 520R, 520G, and 520B may be formed to implement a full color image, and to improve color purity and outdoor visibility. The first to third color filters 520R, 520G, and 520B may absorb stray light (i.e., lower light that is not color-converted by quantum dots), which has passed through the first and second color conversion layers QD1 and QD2 without having its wavelength converted by the first and second color conversion layers QD1 and QD2, and to transmit only light having a desired wavelength. For example, light having passed through the first color filter 520R may emit red light, light having passed through the second color filter 520G may emit green light, and light having passed through the third color filter 520B may emit blue light.

The black matrix 510 may be disposed between the first to third color filters 520R, 520G, and 520B to correspond to the non-emission area NEA. The black matrix 510 may improve color sharpness and contrast. The black matrix 510 may include at least one of a black pigment, a black dye, or black particles. In some embodiments, the black matrix 510 may include a material, such as Cr or $CrO_X$, $Cr/CrO_X$, $Cr/CrO_X/CrN_Y$, a resin (carbon pigment, RGB mixed pigment), graphite, or a non-Cr based material.

Color filters arranged adjacent to each other among the first to third color filters 520R, 520G, and 520B may be arranged to overlap each other in the non-emission area NEA. In this manner, the light blocking rate may be improved. In some embodiments, the color filter 520 and the black matrix 510 may be omitted.

Figure 11:
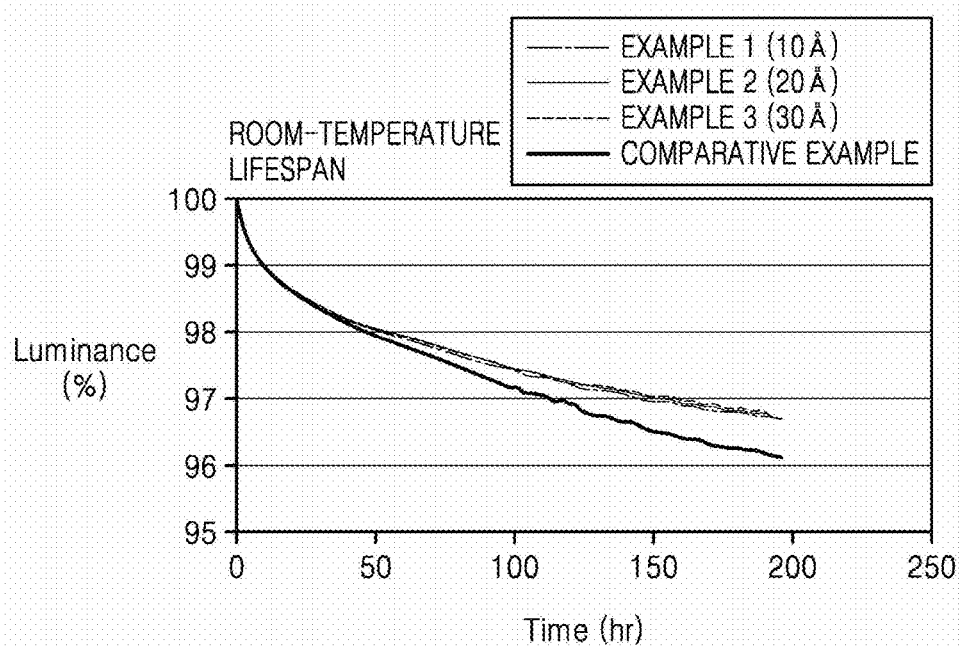
FIG. 11 is a graph illustrating the room-temperature lifespan of organic light-emitting diodes according to embodiments.
Figure 12:
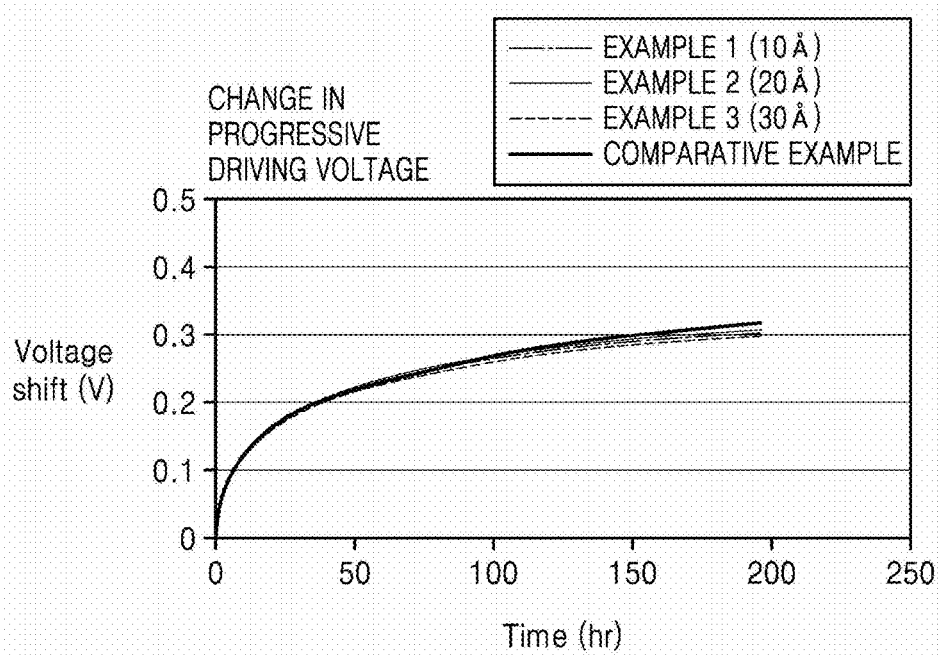
FIG. 12 is a graph illustrating a change in progressive driving voltage of organic light-emitting diodes according to embodiments.

FIG. 10 is a table illustrating the efficiency of organic light-emitting diodes according to embodiments. FIG. 11 is a graph illustrating the room-temperature lifespan of organic light-emitting diodes according to embodiments. FIG. 12 is a graph illustrating a change in progressive driving voltage of organic light-emitting diodes according to embodiments.

FIGS. 10 to 12 are data obtained as a result of analysis through the same experiment, and the luminous efficiency, room-temperature lifespan, and driving voltage of an organic light-emitting diode OLED including the stack of two emitting units shown in FIG. 3 were measured.

Referring to FIG. 10, the efficiency of each organic light-emitting diode was measured. In particular, an organic light-emitting diode that does not include a metal interlayer MTh was used as a Comparative Example, and organic light-emitting diodes including the metal interlayer MIL with different thicknesses were used as Examples 1, 2, and 3, respectively. In the Comparative Example, not being provided with the metal interlayer MTh may mean that the charge generation layer 224 includes only the n-type charge generation layer n-CGL and the p-type charge generation layer p-CGL.

The metal interlayer MTh was set to have a thickness of 10 Å in Example 1, a thickness of 20 Å in Example 2, and a thickness 30 Å in Example 3. The metal interlayers MTh in Examples 1, 2, and 3 may include Mg.

Referring to data on the left (that is, OLED only), which was obtained by measuring the luminous efficiency the organic light-emitting diode OLED without the anti-reflective layer 500, in comparison with the efficiency of the Comparative Example without the metal interlayer MTh being 22.1, it may be seen that the efficiency of Example 1 including the metal interlayer MTh was measured to be 23.4, which was 5.9% higher than the Comparative Example without the metal interlayer MIL, the efficiency of Example 2 was measured to be 22.7, which was 2.7% higher than the Comparative Example without the metal interlayer MIL, and the efficiency of Example 3 was measured to be 23.2, which was 5.0% higher than the Comparative Example without the metal interlayer MTh.

In addition, when the anti-reflective layer 500 including the color filter 520 and the first and second color conversion layers QD1 and QD2 is arranged on the organic light-emitting diode OLED, the luminous efficiency of light emitted through the anti-reflective layer 500 was measured.

Regarding a red pixel R, it may be seen that, in the case of the Comparative Example without the metal interlayer MIL, the efficiency was 3.0, whereas in the cases of Examples 1, 2, and 3 including the metal interlayer MIL, the efficiency increased to 3.6, 3.7, and 3.6, respectively. Regarding a green pixel G, it may be seen that, in the case of the Comparative Example without the metal interlayer MIL, the efficiency was 6.8, whereas in the cases of Examples 1, 2, and 3 including the metal interlayer MIL, the efficiency increased 8.0, 7.9, and 7.8, respectively. In addition, regarding a blue pixel B, it may be seen that, in the case of the Comparative Example without the metal interlayer MIL, the efficiency was 2.4, whereas in the cases of Examples 1, 2, and 3 including the metal interlayer MIL, the efficiency increased 2.8, 2.9, and 2.5, respectively. Regarding a white pixel B, it may be seen that, in the case of the Comparative Example without the metal interlayer MIL, the efficiency was 4.8, whereas in the cases of Examples 1, 2, and 3 including the metal interlayer MIL, the efficiency was measured to be 5.6, 5.7, and 5.5, respectively, and a rate of change in the luminous efficiency was 15.9%, 17.4%, and 13.9%, respectively, in an increasing manner as compared to Comparative Example.

Referring to FIG. 11, in terms of the room-temperature lifespan of the organic light-emitting diode, the luminance of the organic light-emitting diode decreases over time. As in the Comparative Example, the luminance of the organic light-emitting diodes in Examples 1, 2, and 3 also decrease over time. However, in terms of a rate of decrease, it may be seen that the rate of decrease in luminance in the cases of Examples 1, 2, and 3 is less than that of the Comparative Example. It may be seen that a difference in the rate of decrease in luminance becomes apparent after 50 hours, and the difference gradually increases.

As such, the organic light-emitting diode according to an embodiment includes the metal interlayer MIL between the n-type charge generation layer n-CGL and the p-type charge generation layer p-CGL of the charge generation layer 224, and thus, a stepwise energy level may be formed in the charge generation layer 224 to facilitate movement of electrons. In this manner, a decrease in the lifespan of the organic light-emitting diode due to deterioration in the charge generation layer 224 may be reduced or at least be suppressed, as shown in the graph of FIG. 11.

Referring to the graph in FIG. 12, a y-axis indicates an amount of change in voltage required for driving the organic light-emitting diode to emit light having the same luminance. As with the graph of FIG. 11 described above, when the same voltage is supplied, the luminance of the organic light-emitting diode decreases over time. As such, the voltage required to be supplied to the organic light-emitting diode for constant emission of light having the same luminance increases with the passage of time.

Referring to FIGS. 11 and 12 together, it may be seen that, in the cases of Examples 1, 2, and 3, the rate of decrease in luminance is less than that of the Comparative Example, whereas the amount of change in voltage for driving the organic light-emitting diode to emit light having the same luminance, that is, an amount of change in progressive driving voltage is substantially the same as in the Comparative Example.

FIG. 13 is a table illustrating the efficiency of organic light-emitting diodes according to embodiments.

In FIG. 13, the luminous efficiency of an organic light-emitting diode including the stack of four emitting units shown in FIG. 7 was measured.

Referring to FIG. 13, the organic light-emitting diode without the metal interlayer MTh was used as the Comparative Example, an organic light-emitting diode in which a metal interlayer MTh is provided only in the charge generation layer 224 between the third stack ST3 and the fourth stack ST4 shown in FIG. 7 was used as Example 4, and an organic light-emitting diode in which metal interlayers MTh are provided in all of the charge generation layers 224, which are respectively disposed between the first to fourth stacks ST1, ST2, ST3, and ST4 as shown in FIG. 7 was used as Example 5. The metal interlayers MTh in Examples 4 and 5 are formed to have a thickness of 10 Å. Also, an organic light-emitting diode in which a metal interlayer MIL is provided only in the charge generation layer 224 between the second stack ST2 and the third stack ST3 shown in FIG. 7 was used as Example 6, and an organic light-emitting diode in which a metal interlayer MIL is provided only in the charge generation layer 224 between the third stack ST3 and the fourth stack ST4 shown in FIG. 7 was used as Example 7. The metal interlayers MIL in Examples 6 and 7 are formed to have a thickness of 30 Å. The metal interlayers MIL in Examples 4 to 7 may include Mg.

Referring to data on the left (that is, the OLED only) obtained by measuring the luminous efficiency of only the organic light-emitting diode OLED without the anti-reflective layer 500, in comparison with the efficiency of the Comparative Example without the metal interlayer MIL being 49.4, it may be seen that the luminous efficiency of Example 4 including the metal interlayer MIL was measured to be 50.7%, which was 2.6% higher than the Comparative Example without the metal interlayer MIL, the luminous efficiency of Example 5 was measured to be 49.8%, which was 0.8% higher than the Comparative Example without the metal interlayer MIL, the luminous efficiency of Example 6 was measured to be 50.2%, which was 1.6% higher than the Comparative Example without the metal interlayer MIL, and the luminous efficiency of Example 7 was measured to be 50.7%, which was 2.6% higher than the Comparative Example without the metal interlayer MTh.

Figure 14:
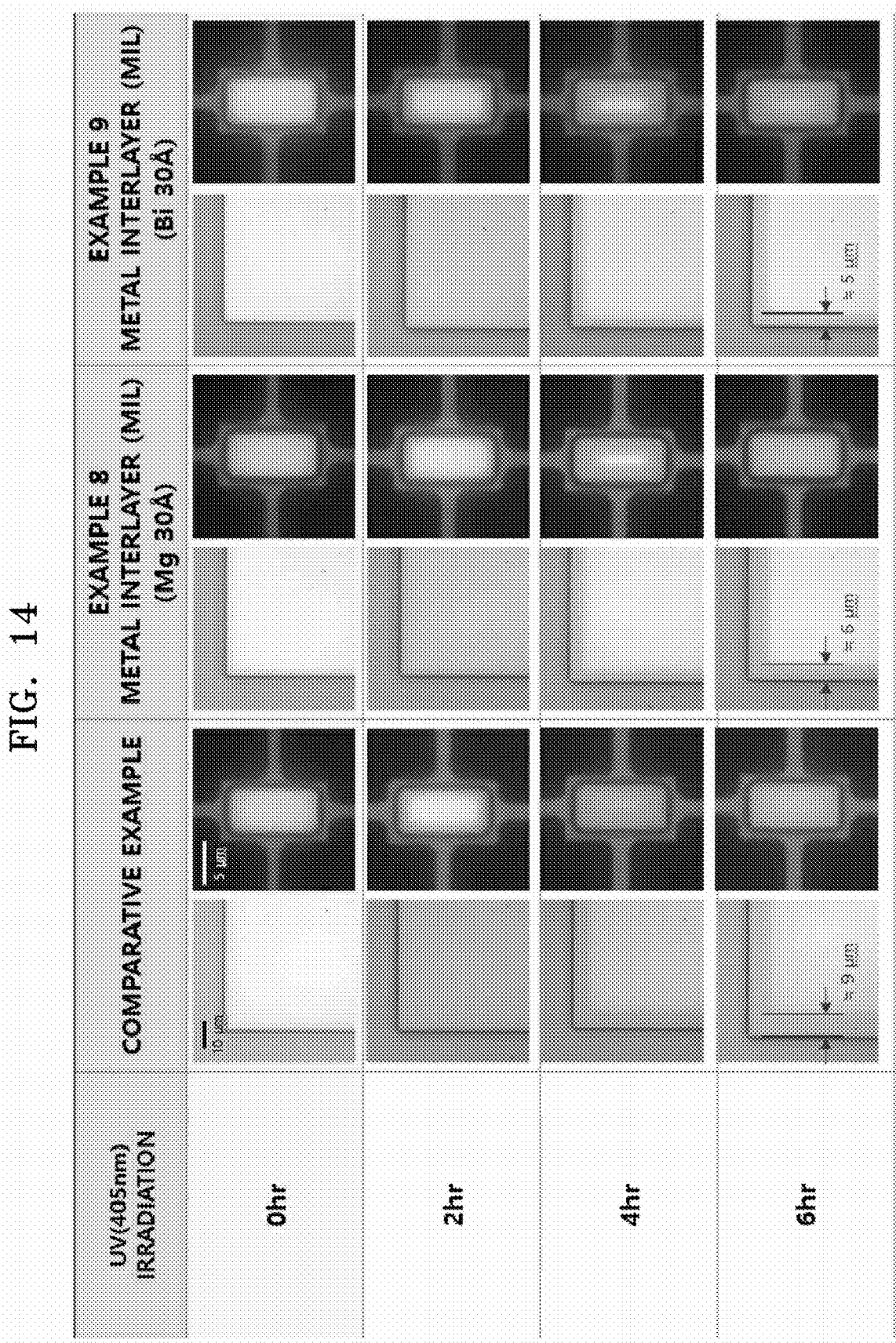
FIGS. 14 and 15 are tables illustrating results of comparative experiments on the degree of shrinkage of a pixel of an organic light-emitting diode according to embodiments.
Figure 15:
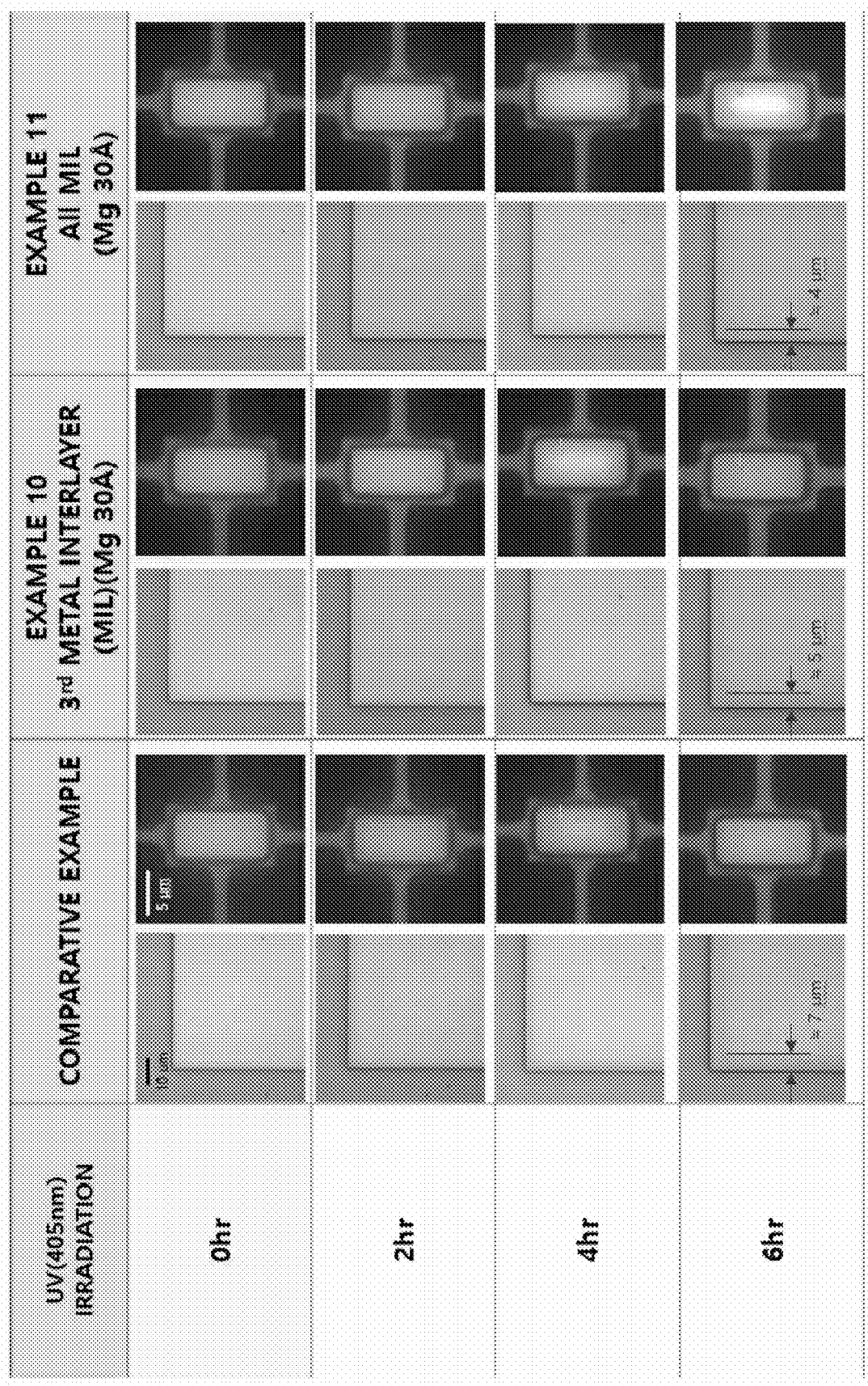

FIGS. 14 and 15 are tables illustrating results of comparative experiments on the degree of shrinkage of a pixel of an organic light-emitting diode according to an embodiment.

FIG. 14 illustrates a result of an experiment conducted on pixel shrinkage of an organic light-emitting diode including the stack of two emitting units as shown in FIG. 3, and FIG. 15 illustrates a result of an experiment conducted on pixel shrinkage of an organic light-emitting diode including the stack of four emitting units as shown in FIG. 7.

More particularly, the organic light-emitting diode without the metal interlayer MTh was used as the Comparative Example, an organic light-emitting diode in which a metal interlayer MIL including Mg is provided in the charge generation layer 224 between the first stack ST1 and the second stack ST2 shown in FIG. 3 was used as Example 8, and an organic light-emitting diode in which a metal interlayer MTh including Bi is provided in the charge generation layer 224 between the first stack ST1 and the second stack ST2 shown in FIG. 3 was used as Example 9, an organic light-emitting diode in which a metal interlayer MTh including Mg is provided only in the charge generation layer 224 between the third stack ST3 and the fourth stack ST4 shown in FIG. 7 was used as Example 10, and an organic light-emitting diode in which metal interlayers MIL including Mg are provided in all of the charge generation layers 224, which are respectively disposed between the first to fourth stacks ST1, ST2, ST3, and ST4 as shown in FIG. 7 was used as Example 10. The metal interlayers MIL in Examples 8 to 11 are formed to have a thickness of 30 Å.

Referring to FIG. 14, it may be seen that, in the cases of the Comparative Example, Example 8, and Example 9, all pixels initially have the same emission area, whereas in the case of the Comparative Example, the degree of pixel shrinkage accelerates over time than in Examples 8 and 9. In FIG. 14, as a result of measuring an emission area of a pixel after a predetermined time, for example, 6 hours, it may be seen that, in the case of the Comparative Example, the width of the emission area of the pixel decreased to about 9 μm, whereas in the cases of Examples 8 and 9, the width of the emission area of the pixel was decreased to about 6 μm and about 5 μm, respectively.

Referring to FIG. 15, it may be seen that, in the cases of the Comparative Example, Example 10, and Example 11, all pixels initially have the same emission area, but in the case of the Comparative Example, the degree of pixel shrinkage accelerates over time than in Examples 10 and 11. In FIG. 15, as a result of measuring an emission area of a pixel after the predetermined time, for example, 6 hours, it may be seen that, in the case of the Comparative Example, the width of the emission area of the pixel decreased to about 7 μm, whereas in the cases of Examples 10 and 11, the width of the emission area of the pixel was decreased to about 5 μm and about 4 μm, respectively.

As such, based on the measurement experiments of FIGS. 14 and 15, it may be confirmed that the organic light-emitting diode according to the illustrated embodiment including the metal interlayer MTh is more resistant to pixel shrinkage.

According to the embodiments as described above, an organic light-emitting diode having low driving voltage, high efficiency, and long lifespan, and a display apparatus including the same may be implemented.

Although certain embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A display apparatus comprising:
   a substrate;
   a pixel electrode above the substrate;
   an opposite electrode facing the pixel electrode;
   a first emission layer;
   a second emission layer above the first emission layer, and overlapping the first emission layer between the pixel electrode and the opposite electrode; and
   a charge generation layer between the first emission layer and the second emission layer, and comprising an n-type charge generation layer, a p-type charge generation layer having a portion directly contacting a portion of the n-type charge generation layer, and a metal interlayer comprising bismuth (Bi) between the n-type charge generation layer and the p-type charge generation layer and having a work function of about −6.0 eV to about −3.5 Ev.

2. The display apparatus of claim 1, wherein a thickness of the metal interlayer is in a range of about 1 Å to about 100 Å.

3. The display apparatus of claim 1, wherein a thickness of the metal interlayer is less than a thickness of the n-type charge generation layer and a thickness of the p-type charge generation layer.

4. The display apparatus of claim 1, wherein the metal interlayer includes a single layer.

5. The display apparatus of claim 1, wherein the metal interlayer includes metal particles dispersed on the n-type charge generation layer.

6. The display apparatus of claim 1, wherein the metal interlayer further includes at least one of magnesium (Mg) or zinc (Zn).

7. The display apparatus of claim 1, wherein the n-type charge generation layer includes an organic semiconductor material and a metal dopant.

8. The display apparatus of claim 7, wherein the metal dopant includes metal having a work function of less than about-3 eV.

9. The display apparatus of claim 8, wherein the metal dopant includes a lanthanum-based metal or an alkali-based metal.

10. The display apparatus of claim 8, wherein the metal dopant includes lithium (Li), ytterbium (Yb), dysprosium (Dy), europium (Eu), or samarium (Sm).

11. The display apparatus of claim 7, wherein a volume ratio of the organic semiconductor material to the metal dopant is about 99:1 to about 90:10.

12. The display apparatus of claim 1, wherein:
the p-type charge generation layer includes a first organic semiconductor material, and a second organic semiconductor material that is different from the first organic semiconductor material; and
a volume ratio of the first organic semiconductor material to the second organic semiconductor material is about 99:1 to about 80:20.

13. The display apparatus of claim 1, further comprising:
a color conversion layer above the opposite electrode and corresponding to the pixel electrode; and
a color filter above the color conversion layer.

14. The display apparatus of claim 13, wherein the color conversion layer includes quantum dots.

15. The display apparatus of claim 2, wherein the thickness of the metal interlayer is in a range of about 10 Å to about 30 Å.

16. An organic light-emitting diode comprising:
a pixel electrode above a substrate;
an opposite electrode facing the pixel electrode;
'm' emitting units between the pixel electrode and the opposite electrode, 'm' being an integer greater than or equal to 2; and
'm−1' charge generation layers between two adjacent emitting units among the 'm' emitting units, and including an n-type charge generation layer and a p-type charge generation layer having a portion directly contacting a portion of the n-type charge generation layer,
wherein at least one of the 'm−1' charge generation layers includes a metal interlayer comprising bismuth (Bi) between the n-type charge generation layer and the p-type charge generation layer and having a work function of about-6.0 eV to about-3.5 eV.

17. The organic light-emitting diode of claim 16, wherein a thickness of the metal interlayer is in a range of about 1 Å to about 100 Å.

18. The organic light-emitting diode of claim 16, wherein the metal interlayer includes metal particles dispersed on the n-type charge generation layer.

19. The organic light-emitting diode of claim 18, wherein the n-type charge generation layer and the p-type charge generation layer are in contact with each other in at least some areas with the metal interlayer between the at least some areas.

20. The organic light-emitting diode of claim 16, wherein the n-type charge generation layer includes an organic semiconductor material and a metal dopant including metal having a work function of less than about-3 eV.

21. The organic light-emitting diode of claim 20, wherein the metal dopant includes a lanthanum-based metal.

22. The organic light-emitting diode of claim 20, wherein the metal dopant includes lithium (Li), ytterbium (Yb), dysprosium (Dy), europium (Eu), or samarium (Sm).

* * * * *